US010163871B2

(12) United States Patent
Kumar et al.

(10) Patent No.: US 10,163,871 B2
(45) Date of Patent: Dec. 25, 2018

(54) INTEGRATED DEVICE COMPRISING EMBEDDED PACKAGE ON PACKAGE (POP) DEVICE

(71) Applicant: QUALCOMM Incorporated, San Diego, CA (US)

(72) Inventors: Rajneesh Kumar, San Diego, CA (US); Chin-Kwan Kim, San Diego, CA (US); Milind Shah, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 58 days.

(21) Appl. No.: 15/097,719

(22) Filed: Apr. 13, 2016

(65) Prior Publication Data

US 2017/0098634 A1    Apr. 6, 2017

Related U.S. Application Data

(60) Provisional application No. 62/236,766, filed on Oct. 2, 2015.

(51) Int. Cl.
*H01L 25/10* (2006.01)
*H01L 23/552* (2006.01)
(Continued)

(52) U.S. Cl.
CPC .......... *H01L 25/105* (2013.01); *H01L 23/552* (2013.01); *H01L 23/66* (2013.01);
(Continued)

(58) Field of Classification Search
CPC ............. H01L 21/6835; H01L 23/3128; H01L 23/49816; H01L 24/17; H01L 25/105
See application file for complete search history.

(56) References Cited

U.S. PATENT DOCUMENTS 7,116,002 B2    10/2006  Chao et al.
7,521,810 B2    4/2009   Kang et al.
(Continued)

FOREIGN PATENT DOCUMENTS

CN    104465427 A    3/2015
CN    104505382 A    4/2015
(Continued)

OTHER PUBLICATIONS

U.S. Appl. No. 15/069,525, filed Mar. 14, 2016, Kumar; Rajneesh et al.
(Continued)

*Primary Examiner* — Marc Armand
(74) *Attorney, Agent, or Firm* — Loza & Loza, LLP/Qualcomm

(57) ABSTRACT

An integrated device that includes a printed circuit board (PCB) and a package on package (PoP) device coupled to the printed circuit board (PCB). The package on package (PoP) device includes a first package that includes a first electronic package component (e.g., first die) and a second package coupled to the first package. The integrated device includes a first encapsulation layer formed between the first package and the second package. The integrated device includes a second encapsulation layer that at least partially encapsulates the package on package (PoP) device. The integrated device is configured to provide cellular functionality, wireless fidelity functionality and Bluetooth functionality. In some implementations, the first encapsulation layer is separate from the second encapsulation layer. In some implementations, the second encapsulation layer includes the first encapsulation layer. The package on package (PoP) device includes a gap controller located between the first package and the second package.

33 Claims, 25 Drawing Sheets

(51) Int. Cl.
*H01L 23/66* (2006.01)
*H01L 25/065* (2006.01)
*H04W 4/80* (2018.01)
*H01L 25/00* (2006.01)
*H04W 4/00* (2018.01)
*H01L 23/00* (2006.01)
*H01L 25/16* (2006.01)
*H01L 21/56* (2006.01)

(52) U.S. Cl.
CPC .......... *H01L 24/19* (2013.01); *H01L 25/0657* (2013.01); *H01L 25/50* (2013.01); *H04W 4/00* (2013.01); *H04W 4/80* (2018.02); *H01L 21/568* (2013.01); *H01L 25/16* (2013.01); *H01L 2224/04105* (2013.01); *H01L 2224/12105* (2013.01); *H01L 2224/16225* (2013.01); *H01L 2224/16227* (2013.01); *H01L 2224/73204* (2013.01); *H01L 2225/1023* (2013.01); *H01L 2225/1041* (2013.01); *H01L 2225/1058* (2013.01); *H01L 2225/1088* (2013.01); *H01L 2924/15174* (2013.01); *H01L 2924/15311* (2013.01); *H01L 2924/181* (2013.01); *H01L 2924/18162* (2013.01); *H01L 2924/19105* (2013.01)

(56) References Cited

U.S. PATENT DOCUMENTS

| | | | |
|---|---|---|---|
| 7,923,830 B2* | 4/2011 | Pope | H01L 23/49816 174/261 |
| 8,503,186 B2 | 8/2013 | Lin et al. | |
| 8,633,591 B2 | 1/2014 | Kurita et al. | |
| 9,001,528 B2* | 4/2015 | Yorita | H01L 21/565 361/816 |
| 2003/0038355 A1 | 2/2003 | Derderian | |
| 2003/0127720 A1* | 7/2003 | Fang | H01L 24/17 257/686 |
| 2004/0061213 A1* | 4/2004 | Karnezos | H01L 23/3128 257/686 |
| 2004/0063246 A1* | 4/2004 | Karnezos | H01L 23/3128 438/108 |
| 2007/0013060 A1* | 1/2007 | Kwon | H01L 24/29 257/725 |
| 2007/0278657 A1 | 12/2007 | Lee | |
| 2008/0116556 A1 | 5/2008 | Chou et al. | |
| 2008/0315375 A1* | 12/2008 | Eichelberger | H01L 21/6835 257/659 |
| 2009/0051046 A1* | 2/2009 | Yamazaki | H01L 21/6835 257/777 |
| 2010/0327419 A1 | 12/2010 | Muthukumar et al. | |
| 2012/0292772 A1* | 11/2012 | Yorita | H01L 21/565 257/758 |
| 2013/0087911 A1* | 4/2013 | Gregorich | H01L 25/105 257/737 |
| 2014/0367854 A1 | 12/2014 | Zhao et al. | |
| 2015/0001689 A1 | 1/2015 | Goetz et al. | |
| 2015/0237713 A1 | 8/2015 | Elsherbini et al. | |
| 2016/0276307 A1* | 9/2016 | Lin | H01L 21/561 |
| 2017/0179039 A1* | 6/2017 | Lee | H01L 23/552 |

FOREIGN PATENT DOCUMENTS

| | | |
|---|---|---|
| EP | 2701191 A2 | 2/2014 |
| TW | 201521164 A | 6/2015 |
| WO | WO-2015099684 A1 | 7/2015 |

OTHER PUBLICATIONS

Marvell: "Marvell Avastar 88W8887 WLAN/Bluetooth/NFC/FM Receive Single-Chip SoC," Quad-Radio Connectivity Solution, 2015, 2 pages.

International Search Report and Written Opinion—PCT/US2016/054021—ISA/EPO—dated Nov. 23, 2016.

* cited by examiner

INTEGRATED DEVICE COMPRISING EMBEDDED PACKAGE ON PACKAGE (POP) DEVICE

CLAIM OF PRIORITY/CLAIM OF BENEFIT

The present application claims priority to U.S. Provisional Application No. 62/236,766 titled "Integrated Device Comprising Embedded Package on Package (PoP) Device", filed Oct. 2, 2015, which is hereby expressly incorporated by reference herein.

BACKGROUND

Field of the Disclosure

Various features may relate to an integrated device, and more specifically to an integrated device that includes an embedded package on package (PoP) device.

Background

Mobile devices, such as smart phones, tablets, Internet of Things (IoT), etc., require a multitude of components, chipsets, and the like. Typically, these components are provided on a printed circuit board with one or more integrated circuits. Packaging these components together into a product is becoming increasingly challenging. FIG. 1 illustrates an integrated device 100 that includes a printed circuit board (PCB) 102, a first integrated circuit (IC) package 104, a second integrated circuit (IC) package 106, a passive component 108 (e.g., capacitor), and a cover 130. The first integrated circuit (IC) package 104, the second integrated circuit (IC) package 106, and the passive component 108 are coupled to the printed circuit board (PCB) 102.

The cover 130 is coupled to the printed circuit board (PCB) 102. The cover 130 may be a metallic material that covers and protects the first integrated circuit (IC) package 104, the second integrated circuit (IC) package 106, and the passive component 108, from an external environment. The use of the cover 130 results in a void in the integrated device 100. Thus, there is wasted space in the integrated device 100. This wasted space in the integrated device 100 limits how small the integrated device 100 can be, which in turns, limits the type of devices in which the integrated device may be implemented.

Reducing the size of an integrated device poses several technical hurdles and challenges. First, as integrated circuits (ICs) are packed closer to each other, they begin to substantially interfere with one another, which may result in one or more non-functioning ICs. Second, packing the ICs closer in an integrated device may cause structural defects, which can result in a defective or non-functioning integrated device.

FIG. 2 illustrates an example of such a defect when ICs are packed close together. As shown, FIG. 2 illustrates a package on package (PoP) device 200 that includes a first package 202, a second package 204 and a void 290. The first package 202 includes a first die 220, a first package substrate 222, and a first encapsulation layer 250. The first package substrate 222 includes a first plurality of pads 224 and a first pad 226. The first die 220 is coupled to the first package substrate 222 through a first plurality of solder balls 228. Specifically, the first die 220 is coupled to the first plurality of pads 224 through the first plurality of solder balls 228. A second plurality of solder balls 236 is coupled to the first package substrate 222.

The second package 204 includes a second die 240, a second package substrate 242, a second pad 246, a third plurality of solder balls 256, and a second encapsulation layer 260. The second die 240 is coupled to the second package substrate 242. The second package 204 is coupled to the first package 202 through the third plurality of solder balls 256. For example, the third plurality solder balls 256 is coupled to the first pad 226 of the first package substrate 222, and the second pad 246 of the second package 204.

FIG. 2 illustrates a void 290 between the first die 220 and the second package substrate 242 of the second package 204. The void 290 is a space in the first encapsulation layer 250. The void 290 may occur when the gap or space between the first die 220 and the second package substrate 242 is too small or narrow to allow the first encapsulation layer 250 to completely flow in between the first die 220 and the second package substrate 242.

The presence of the void 290 can cause warpage and/or deformation (as illustrated by the arrow) in the package on package (PoP) device 200 because of the lack of structural support around that space. One undesirable side effect of the warpage and/or deformation are the weak joints and/or open joints that may occur between the third plurality of solder balls 256 and the first pad 226 and the second pad 246. For example, as shown in FIG. 2, the warpage and/or deformation of the package on package device (PoP) 200 causes increased separation between the first pad 226 and the second pad 246, which effectively stretches the third plurality of solder balls 256 (as illustrated by the arrow), and results in a weaker joint and/or open joint in the package on package (PoP) device 200. A weak joint and/or an open joint can prevent signals from properly traversing through a package on package (PoP) device, resulting in a defective package on package (PoP) device. Thus, to avoid this negative effect, the gap or space between the first die 220 and the second package substrate 242 has to increase, which effectively increases the size of the package on package (PoP) device 200, which is not desirable.

It is desirable to reduce the size, height and/or spaces of devices and packages, so that these devices and packages are placed in smaller devices. Ideally, such a device or package will have a better form factor, be cheaper to fabricate, while at the same time meeting the needs and/or requirements of mobile devices, Internet of things (IoT) devices, and/or wearable devices.

SUMMARY

Various features relate generally to an integrated device, and more specifically to an integrated device that includes an embedded package on package (PoP) device. In some embodiments, the various components for a device are combined into a single package resulting in a system in package (SiP). The SiP may include a plurality of components, such as an application processor, modem, WiFi, global positioning system, Bluetooth, radio frequency components, to provide a functioning mobile communication device, such as a mobile phone, IoT device, etc. In some embodiments, the SiP may be provided as a hermetically sealed package. Within the SiP, the components may be covered or encapsulated, for example with a molding material, and isolated from each other using one or more layers of conductive material in the molding. The conductive layers may provide for signal isolation, noise reduction, improve hermeticity, and reliability and durability of the SiP.

For example, an integrated device may comprise a printed circuit board (PCB) and a package on package (PoP) device coupled to the printed circuit board (PCB). The package on package (PoP) device includes a first package that includes a first die, a second package coupled to the first package, and a first encapsulation layer formed between the first die and the second package. The integrated device includes a second encapsulation layer that at least partially encapsulates the package on package (PoP) device. The integrated device is configured to provide cellular functionality, wireless fidelity (WiFi) functionality and Bluetooth functionality Another example provides an apparatus that includes a printed circuit board (PCB) and a package on package (PoP) device coupled to the printed circuit board (PCB). The package on package (PoP) device includes a first package comprising a first electronic package component and a second package coupled to the first package. The apparatus includes a first encapsulation layer formed between the first package and the second package, and a second encapsulation layer that at least partially encapsulates the package on package (PoP) device. The apparatus is configured to provide cellular functionality means, wireless fidelity (WiFi) functionality means and Bluetooth functionality means.

Another example provides a method for fabricating an integrated device. The method provides a printed circuit board (PCB). The method couples a package on package (PoP) device to the printed circuit board (PCB). Coupling the package on package (PoP) device includes providing a first package comprising a first electronic package component, and coupling a second package to the first package. The method forms a first encapsulation layer between the first package and the second package. The method forms a second encapsulation layer that at least partially encapsulates the package on package (PoP) device. The integrated device is configured to provide cellular functionality, wireless fidelity (WiFi) functionality and Bluetooth functionality.

DRAWINGS

Various features, nature and advantages may become apparent from the detailed description set forth below when taken in conjunction with the drawings in which like reference characters identify correspondingly throughout.

DETAILED DESCRIPTION

Figure 1:
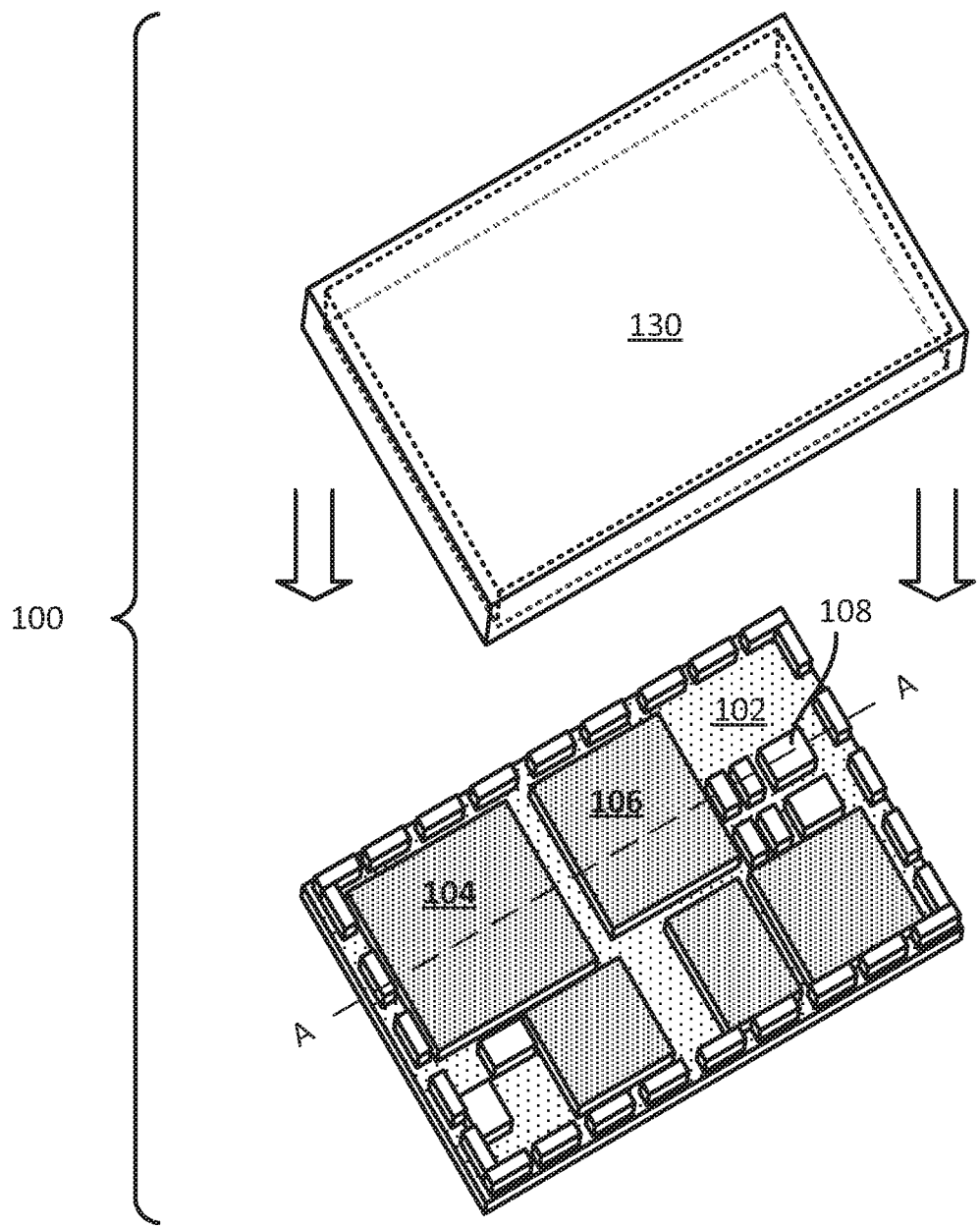
FIG. 1 illustrates a view of an integrated device that includes several packages.
Figure 2:
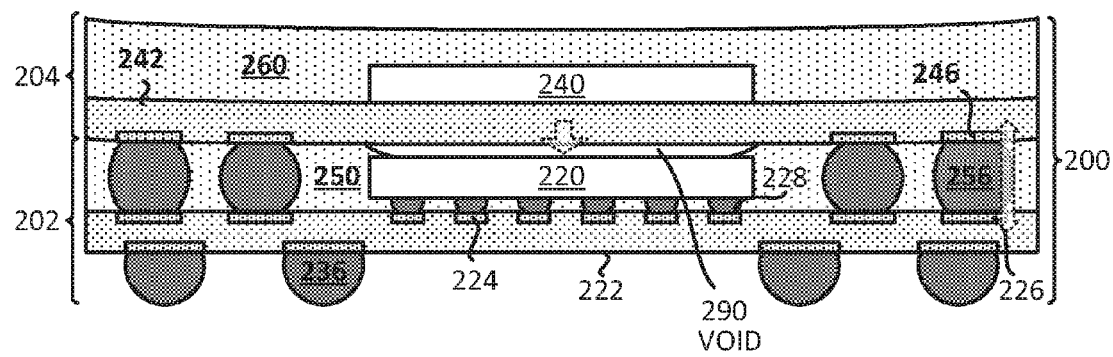
FIG. 2 illustrates a cross-sectional view of a package on package (PoP) device.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to an integrated device that includes a printed circuit board (PCB) and a package on package (PoP) device coupled to the printed circuit board (PCB). The package on package (PoP) device includes a first package that includes a first electronic package component (e.g., first die) and a second package coupled to the first package. The integrated device includes a first encapsulation layer formed between the first package and the second package. The integrated device includes a second encapsulation layer that at least partially encapsulates the package on package (PoP) device. The integrated device is configured to provide cellular functionality, wireless fidelity (WiFi) functionality and Bluetooth functionality. In some implementations, the first encapsulation layer is separate from the second encapsulation layer. In some implementations, the second encapsulation layer includes the first encapsulation layer. The package on package (PoP) device includes at least one gap controller located between the first package and the second package. The integrated device includes an integrated device and/or a System in Package (SiP).

In some implementations, the height of the device and/or package may be defined along the Z-direction of the package, which is shown in the figures of the present disclosure. In some implementations, the Z-direction of the device and/or package may be defined along an axis between a top portion and a bottom portion of the device and/or package. The terms top and bottom may be arbitrarily assigned, however as an example, the top portion of the device and/or package may be a portion comprising an encapsulation layer, while a bottom portion of the package may be a portion comprising a redistribution portion or a plurality of solder balls. In some implementations, the top portion of the package may be a back side of the package, and the bottom portion of the package may be a front side of the package. The front side of the package may be an active side of the package. A top portion may be a higher portion relative to a lower portion. A bottom portion may be a lower portion relative to a higher portion. Further examples of top portions and bottom portions will be further described below.

The X-Y directions of the package may refer to the lateral direction and/or footprint of the package. Examples of X-Y directions are shown in the figures of the present disclosure and/or further described below. In many of the figures of the present disclosure, the devices and/or packages and their respective components are shown across a X-Z cross-section or X-Z plane. However, in some implementations, the packages and their representative components may be represented across a Y-Z cross-section or Y-Z plane.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., data signal, ground signal, power signal). An interconnect may be part of a circuit. An interconnect may include more than one element or component.

Figure 3:
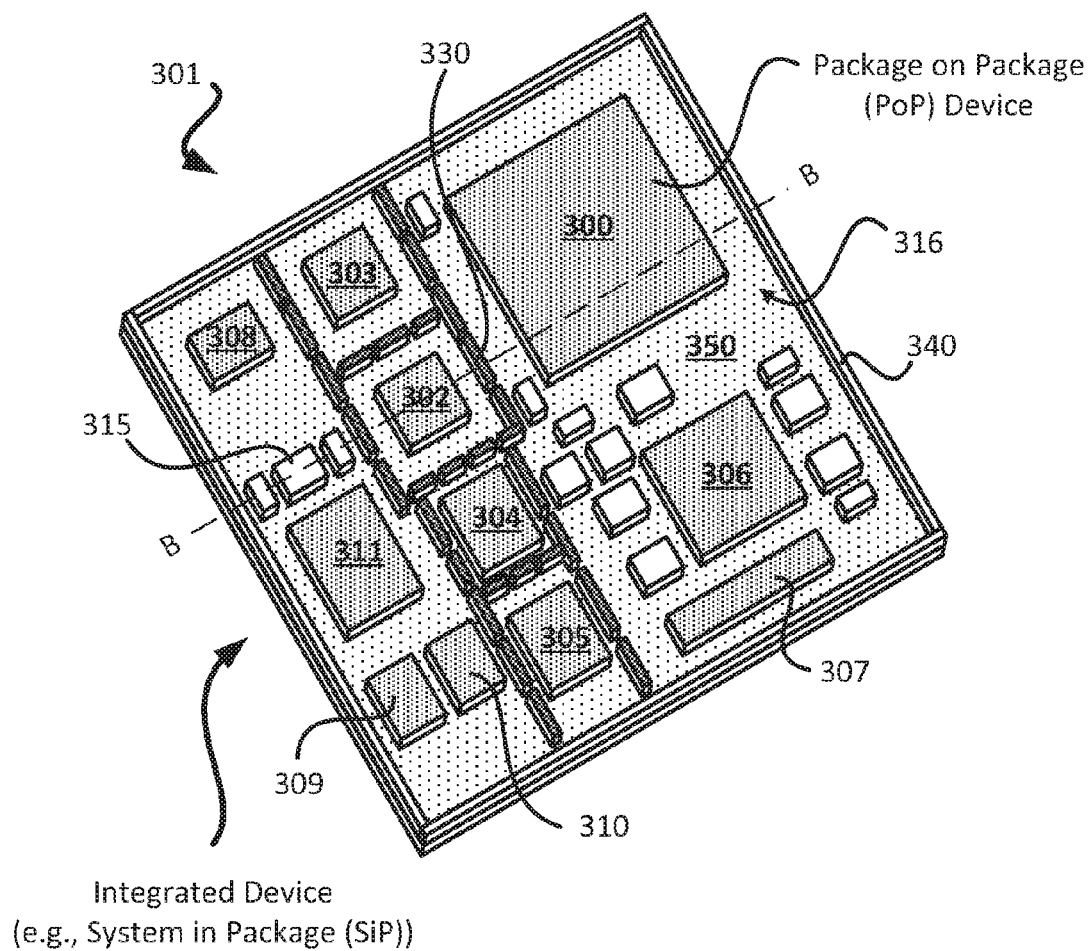
FIG. 3 illustrates a view of an integrated device that includes an embedded a package on package (PoP) device.

Exemplary Integrated Device Comprising an Embedded Package on Package (PoP) Device FIG. 3 illustrates an integrated device 301 that includes a package on package (PoP) device 300, the packages 302-311, a passive component 315, an encapsulation layer 316, an internal shield 330, an external shield 340, and a printed circuit board (PCB) 350. The integrated device 301 may include a System in Package (SiP). One or more of the packages 302-311 may include an integrated circuit (IC) package. The one or more packages 302-311 may be examples of electronic package components.

The package on package (PoP) device 300, the packages 302-311, the passive component 315 (e.g., capacitor), the internal shield 430, and the external shield 440 are coupled to the printed circuit board (PCB) 350. The encapsulation layer 316 may partially or completely encapsulate or cover the package on package (PoP) device 300, the packages 302-311, the passive component 315, and the internal shield 330 in various ways. Although provided as a single system in a package, these components may be isolated from each other mechanically and/or electrically.

For example, as also shown, FIG. 3 illustrates that the internal shield 330 may be configured to surround one or more packages 302-311 and/or the package on package (PoP) device 300. In some implementations, the internal shield 330 is configured to isolate one or more packages 302-311 and/or the package on package (PoP) device 300 so that they don't interfere with one another. A package (e.g., package 302-311) may include a die or may be a die (e.g., semiconductor device). A package (e.g., package 302-311) may include a wafer level package (WLP).

The encapsulation layer 316 serves as a covering or protective structure for the components of the device 300. The encapsulation layer 316 may be a molding compound having various viscosities and thermal properties. Those skilled in the art will recognize that other types of materials may be used in the encapsulation layer 316.

The external shield 340 is configured to at least partially surround the encapsulation layer 316. The external shield 340 is coupled to the internal shield 330. The combination of the internal shield 330 and the external shield 340 may provide shielding for the integrated device 301. The internal shield 330 and the external shield 340 may include a conductive material (e.g., metal, copper). The internal shield 330 and the external shield 340 may have the same material or be different materials. The internal shield 330 may include a metal sheet in some implementations. In some implementations, the internal shield 330 has a thickness of about 250 microns (μm) or less. In some implementations, the external shield 340 has a thickness of about 50 microns (μm) or less.

The integrated device 301 may include any component that is configured to provide several mobile functionalities and capabilities, including but not limited to, positioning functionality, wireless connectivity functionality (e.g., wireless communication) and/or cellular connectivity functionality (e.g., cellular communication). Examples of positioning functionality, wireless and/or cellular connectivity functionalities include global positioning system (GPS) functionality, wireless fidelity (WiFi) functionality, Bluetooth functionality, and radio frequency (RF) functionality (e.g., Radio Frequency Front End (RFFE) functionality). Examples of RFFE functionalities include Global System for Mobile Communications (GSM), Wideband Code Division Multiple Access (WCDMA), Frequency Division Duplex Long-Term Evolution (FDD-LTE), Time Division Duplex Long-Term Evolution (TDD-LTE). These functionalities may be implemented in one or more packages 302-311 and/or the package on package (PoP) device 300. The above mobile functionalities are further described below in FIG. 11.

FIG. 3 further illustrates the integrated device 301 may include an embedded package on package (PoP) device 300. In some implementations, embedding the package on package (PoP) device 300 with the integrated device 301, provides an integrated device with an overall form factor (e.g., size, area, volume) that is smaller than other conventional integrated devices, while providing an integrated device that includes a comprehensive, full and/or complete range of mobile functionalities. Exemplary sizes for integrated devices with such mobile functionalities are further described below in FIG. 11.

In some implementations, the integrated device 301 that includes at least some of the above mobile functionalities (e.g., cellular functionality, wireless fidelity (WiFi) functionality and Bluetooth functionality) is made possible through the structures and/or fabrication processes described in the present application. As will be further described below, fabricating an integrated device (e.g., integrated device 301) with many mobile functionalities, a small form factor, and that is encapsulated in an encapsulation layer (e.g., fully encapsulated by an encapsulation layer) includes many fabrication and manufacturing challenges that are addressed in the present application. In particular, as the size and spacing between components in an integrated device becomes smaller, defects appears, which causes performance and reliability issues in the integrated device. These issues are of especially great concern for integrated devices that provide mobile functionalities (e.g., cellular functionality, wireless fidelity (WiFi) functionality, Bluetooth functionality), as these integrated devices are being implemented in smaller electronic devices. The integrated devices (e.g., integrated device 301) and fabrication processes described in the present application provide a solution that addresses those issues, concerns, problems and challenges.

FIG. 3 further illustrates an example of an integrated device 301 that is hermetically sealed through the use of one or more encapsulation layer(s), which helps improve the reliability and durability of the integrated device 301.

FIGS. 4-7 illustrate various profile views across a cross section BB of the integrated device 301 that includes a package on package (PoP) device. Although not shown in FIGS. 4-7, in some implementations, a package on package (PoP) device may include one or more gap controllers. Examples of some gap controllers are further described below with reference to FIGS. 12-25.

Figure 4:
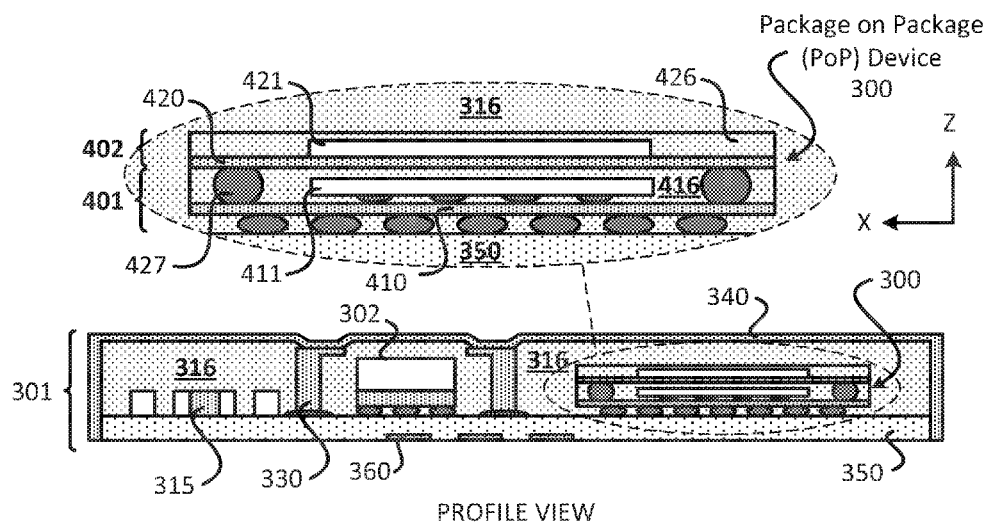
FIG. 4 illustrates a profile view of an integrated device that includes an embedded a package on package (PoP) device.

FIG. 4 illustrates a profile view of the integrated device 301. As shown in FIG. 4, the integrated device 301 includes the printed circuit board (PCB) 350, the package on package (PoP) device 300, the package 302, the passive component 315, the encapsulation layer 316 (e.g., second encapsulation layer), the internal shield 330, and the external shield 340. The printed circuit board (PCB) 350 includes a plurality of interconnects 360 (e.g., pads). The package on package (PoP) device 300, the package 302, the passive component 315, the internal shield 330 and the external shield 340 are coupled to the printed circuit board (PCB) 350. The encapsulation layer 316 at least partially encapsulates the package on package (PoP) device 300, the package 302, the passive component 315 and the internal shield 330.

The package on package (PoP) device 300 includes a first package 401, a second package 402, and a first encapsulation layer 416. The second package 402 is coupled to the first package 401 through a plurality of package interconnects 427. The plurality of package interconnects 427 includes a solder interconnect (e.g., solder ball).

The first package 401 includes a first package substrate 410 and a first die 411. The second package 402 includes a second package substrate 420 and a second die 421. The first encapsulation layer 416 is formed between the first package 401 and the second package 402. In particular, the first encapsulation layer 416 is at least formed between the first die 411 (e.g., back side surface of the first die 411) and the second package substrate 420 (e.g., bottom surface of second package substrate 420).

FIG. 4 illustrates that the encapsulation layer 316 and the first encapsulation layer 416 are separate encapsulation layers. In some implementations, those skilled in the art will recognize that the encapsulation layer that encapsulates the package on package (PoP) device 300 may be the same encapsulation layer that is formed in the package on package (PoP) device 300.

Figure 5:
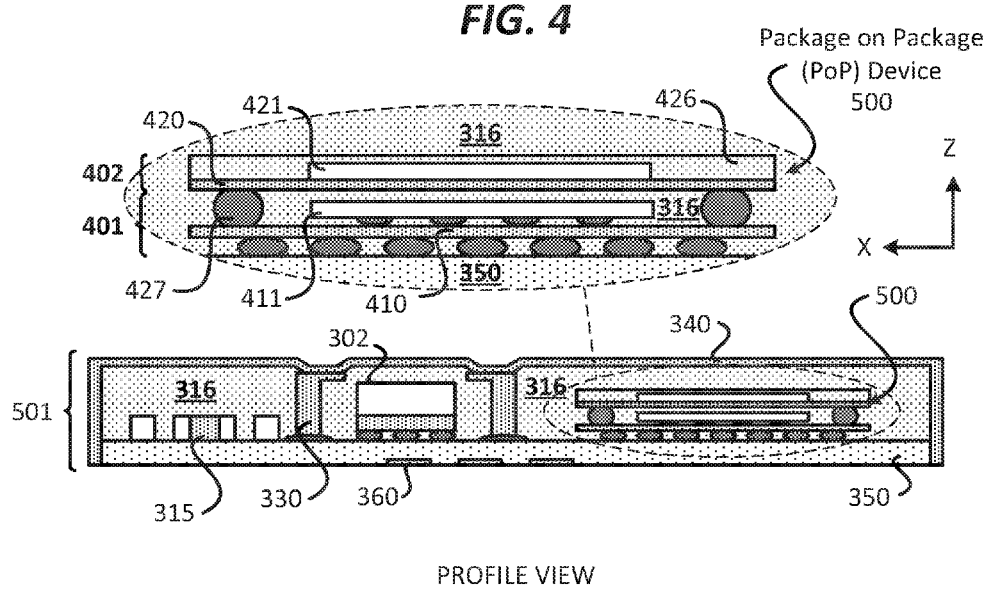
FIG. 5 illustrates a profile view of another integrated device that includes an embedded a package on package (PoP) device.

FIG. 5 illustrates the integrated device 501 that includes a package on package (PoP) device. The integrated device 501 of FIG. 5 is similar to the integrated device 301 of FIG. 4, except that the package on package (PoP) device 500 is embedded differently in the integrated device 501.

The package on package (PoP) device 500 includes a first package 401 and a second package 402. The first package 401 includes the first package substrate 410 and the first die 411. The second package 402 is coupled to the first package 401 through the plurality of package interconnects 427.

As shown in FIG. 5, the encapsulation layer 316 at least partially encapsulates the package on package (PoP) device 500, and is formed between the first package 401 and the second package 402. In particular, the encapsulation layer 316 is at least formed between the first die 411 (e.g., back side surface of the first die 411) and the second package substrate 420 (e.g., bottom surface of second package substrate 420). In some implementations, providing an encapsulation layer that both encapsulates and embeds the package on package (PoP) device 500 may enable an integrated device 501 that is low cost and has a small form factor, as it may reduce the number of processes to fabricate the integrated device.

Figure 6:
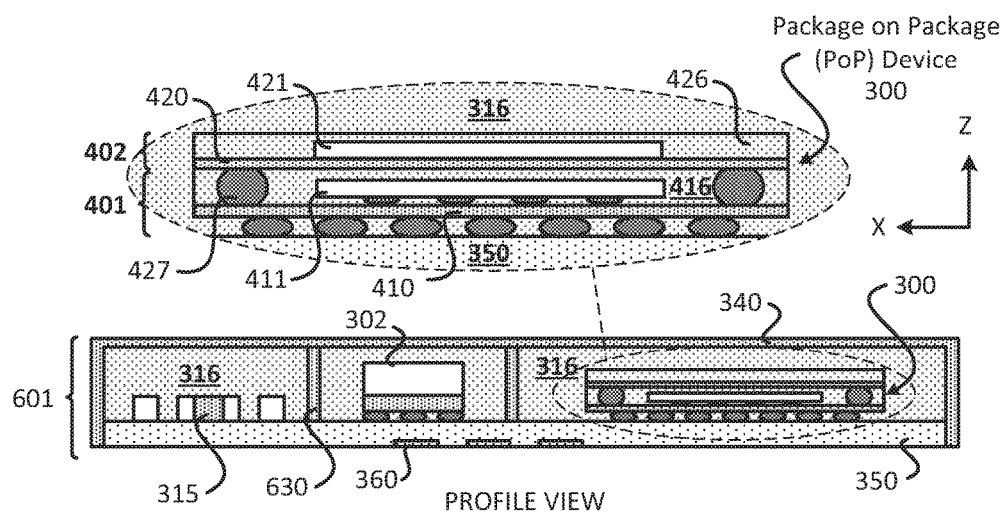
FIG. 6 illustrates a profile view of another integrated device that includes an embedded a package on package (PoP) device.

FIG. 6 illustrates an integrated device 601 that includes a package on package (PoP) device. The integrated device 601 of FIG. 6 is similar to the integrated device 301 of FIG. 4, except that the integrated device 601 may comprise an internal shield 630 that is different than the internal shield 330 of the integrated device 301. In particular, the internal shield 630 may be thinner than the internal shield 330. In some implementations, the internal shield 630 is formed using a different process than the internal shield 330. As mentioned above, the internal shield 330 may include a metal sheet that has been worked to form a desired shape and then coupled to the printed circuit board (PCB) 350 with solder or some other conductive mechanism. In some implementations, the internal shield 630 may be a metal layer (e.g., copper layer) that is formed (e.g., deposited, pasted) in a cavity of the encapsulation layer 316. The internal shield 630 is coupled to the external shield 340 and the printed circuit board (PCB) 350.

Figure 7:
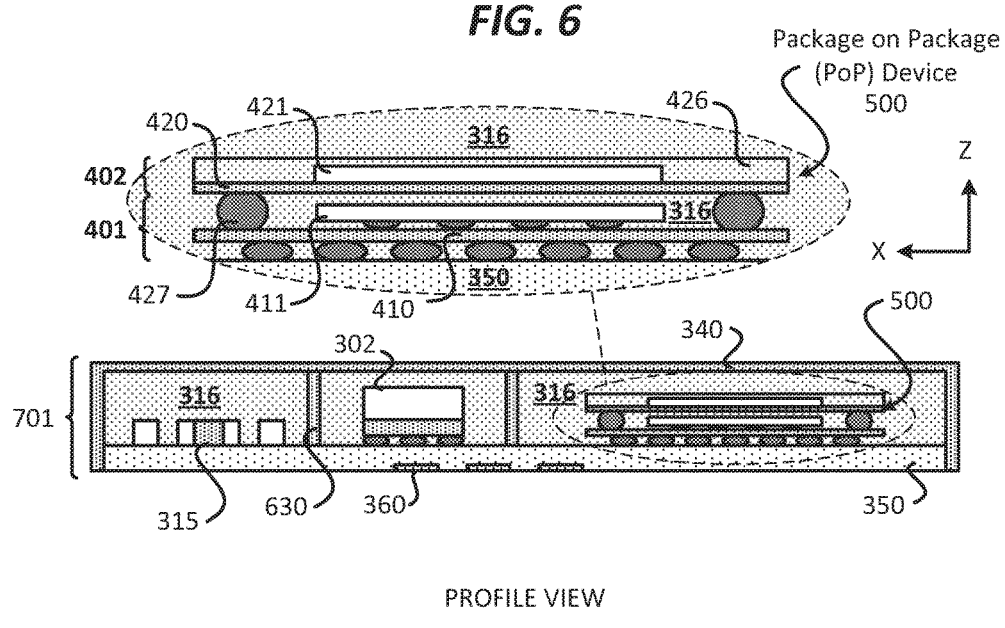
FIG. 7 illustrates a profile view of another integrated device that includes an embedded a package on package (PoP) device.

FIG. 7 illustrates an integrated device 701 that includes a package on package (PoP) device. The integrated device 701 of FIG. 7 is similar to the integrated device 601 of FIG. 6, except that the package on package (PoP) device 500 is embedded differently in the integrated device 701.

The package on package (PoP) device 500 includes a first package 401 and a second package 402. The first package 401 includes the first package substrate 410 and the first die 411. The second package 402 is coupled to the first package 401 through the plurality of package interconnects 427.

As shown in FIG. 7, the encapsulation layer 316 at least partially encapsulates the package on package (PoP) device 500, and is formed between the first package 401 and the second package 402. In particular, the encapsulation layer 316 is at least formed between the first die 411 (e.g., back side surface of the first die 411) and the second package substrate 420 (e.g., bottom surface of second package substrate 420). In some implementations, providing an encapsulation layer that both encapsulates and embeds the package on package (PoP) device 500 may enable an integrated device 701 that is low cost and has a small form factor, as it may reduce the number of processes to fabricate the integrated device.

Although not shown in FIGS. 4-7, in some implementations, a package on package (PoP) device (e.g., 300, 500) may include one or more gap controllers. A gap controller may be configured to provide mechanical support and stability in the package on package (PoP) device. A gap controller may be provided to ensure that there is enough space for an encapsulation layer (e.g., 316, 416) to form between the first die 411 and the second package substrate 420. In some implementations, one or more gap controllers may include one or more material that is electrically conductive. However, the gap controller is configured to not provide an electrical path for an electrical signal. Examples of gap controllers are further described below with reference to FIGS. 12-25.

Accordingly, FIGS. 3-7 describe various package on package (PoP) devices in an integrated device (e.g., SiP). Different implementations may embed different package on package (PoP) devices in an integrated device. Detailed examples of different package on package (PoP) devices that may be implemented and/or embedded in the integrated device 301 and/or any other integrated devices described in the present disclosure are further described below with reference to at least FIGS. 12-25.

Having described various examples of an integrated device that includes an embedded package on package (PoP) device, various processes and methods for fabricating an integrated device that includes an embedded package on package (PoP) device will now be described.

Figure 8:
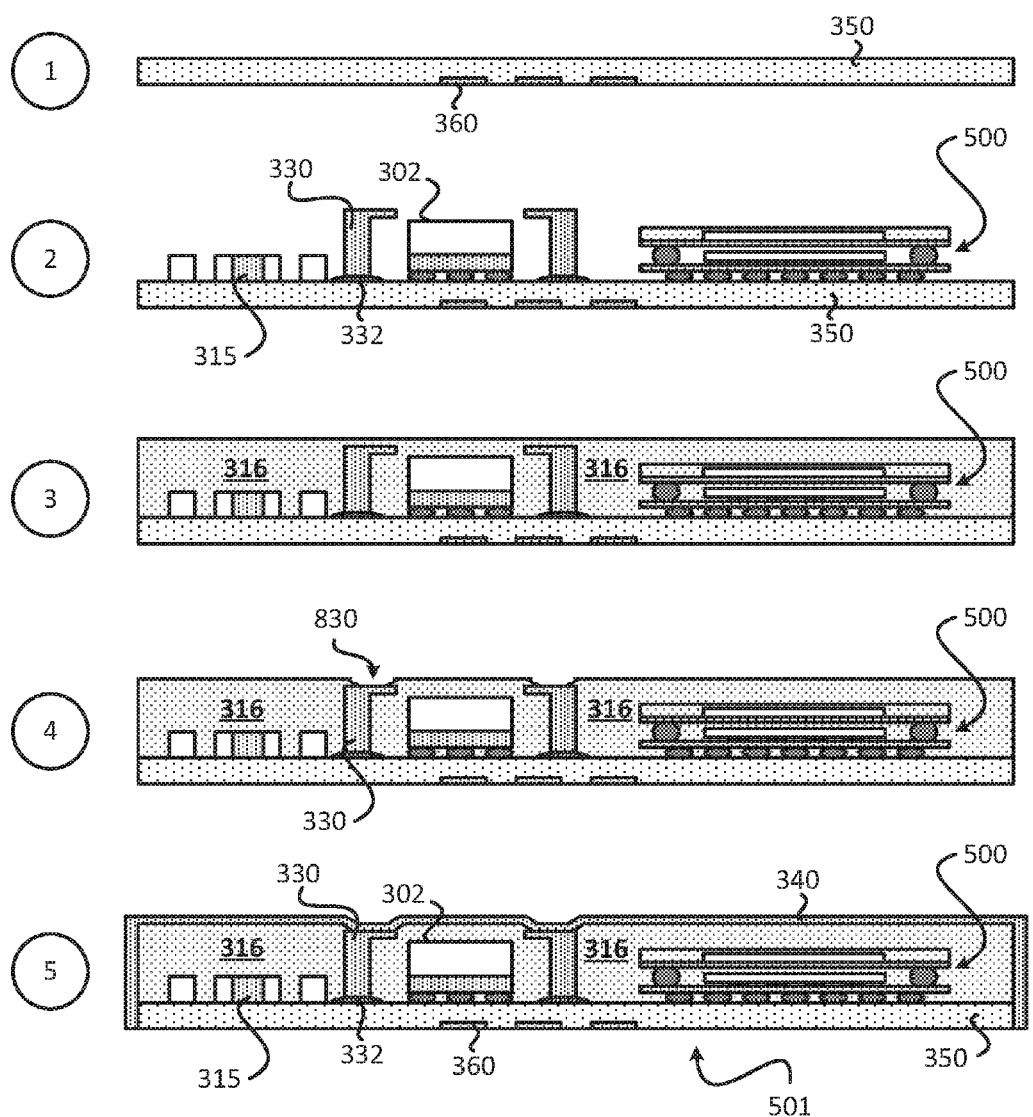
FIG. 8 illustrates an example of a sequence for fabricating an integrated device that includes an embedded a package on package (PoP) device.

Exemplary Sequence for Fabricating an Integrated Device Comprising an Embedded Package on Package (PoP) Device In some implementations, providing/fabricating an integrated device that includes an embedded package on package (PoP) device includes several processes. FIG. 8 illustrates an exemplary sequence for providing/fabricating integrated device that includes an embedded package on package (PoP) device. In some implementations, the sequence of FIG. 8 may be used to fabricate the integrated device that includes an embedded package on package (PoP) device of FIGS. 3-5 and/or other integrated devices described in the present disclosure. FIG. 8 will now be described in the context of providing/fabricating the integrated device of FIG. 5.

It should be noted that the sequence of FIG. 8 may combine one or more stages in order to simplify and/or clarify the sequence for providing integrated device that includes an embedded package on package (PoP) device. In some implementations, the order of the processes may be changed or modified.

Stage 1 illustrates a state after a printed circuit board (PCB) 350 that includes a plurality of interconnects 360 is provided. In some implementations, the printed circuit board (PCB) 350 is provided by a supplier or fabricated.

Stage 2 illustrates the package on package (PoP) device 500, the internal shield 330, and the passive component 315 coupled to the printed circuit board (PCB) 350. In some implementations, a solder reflow process is used to couple the package on package (PoP) device 500, the internal shield 330, and the passive component 315 (e.g., through the use of solder interconnects) to the printed circuit board (PCB) 350. For example the internal shield 330 is coupled to the printed circuit board (PCB) 350 through a solder interconnect 332.

Stage 3 illustrates the encapsulation layer 316 at least partially formed over the package on package (PoP) device 500, the internal shield 330, and the passive component 315. For example, the encapsulation layer 316 may be formed using a molding compound and temperature cured using known processes and tools.

Stage 4 illustrates a state after a cavity 830 is formed in the encapsulation layer 316 that exposes part of the internal shield 330. Different implementations may use different processes to form the cavity 830. A laser process and/or a photo-lithography process may be used to form the cavity 830.

Stage 5 illustrates a state after the external shield 340 is formed over the encapsulation layer 316. The external shield 340 may be formed using various materials, such as a conductive paste, copper or other conductive metals, and the like. As shown at stage 5, the external shield 340 is coupled to the internal shield 330 and the printed circuit board (PCB) 350. In some implementations, stage 5 illustrates the integrated device 601 that includes the package on package (PoP) device 500, the package 302, the passive component 315, the internal shield 330, the solder interconnect 332, the encapsulation layer 316, the printed circuit board (PCB) 350, and the external shield 340.

Figure 9:
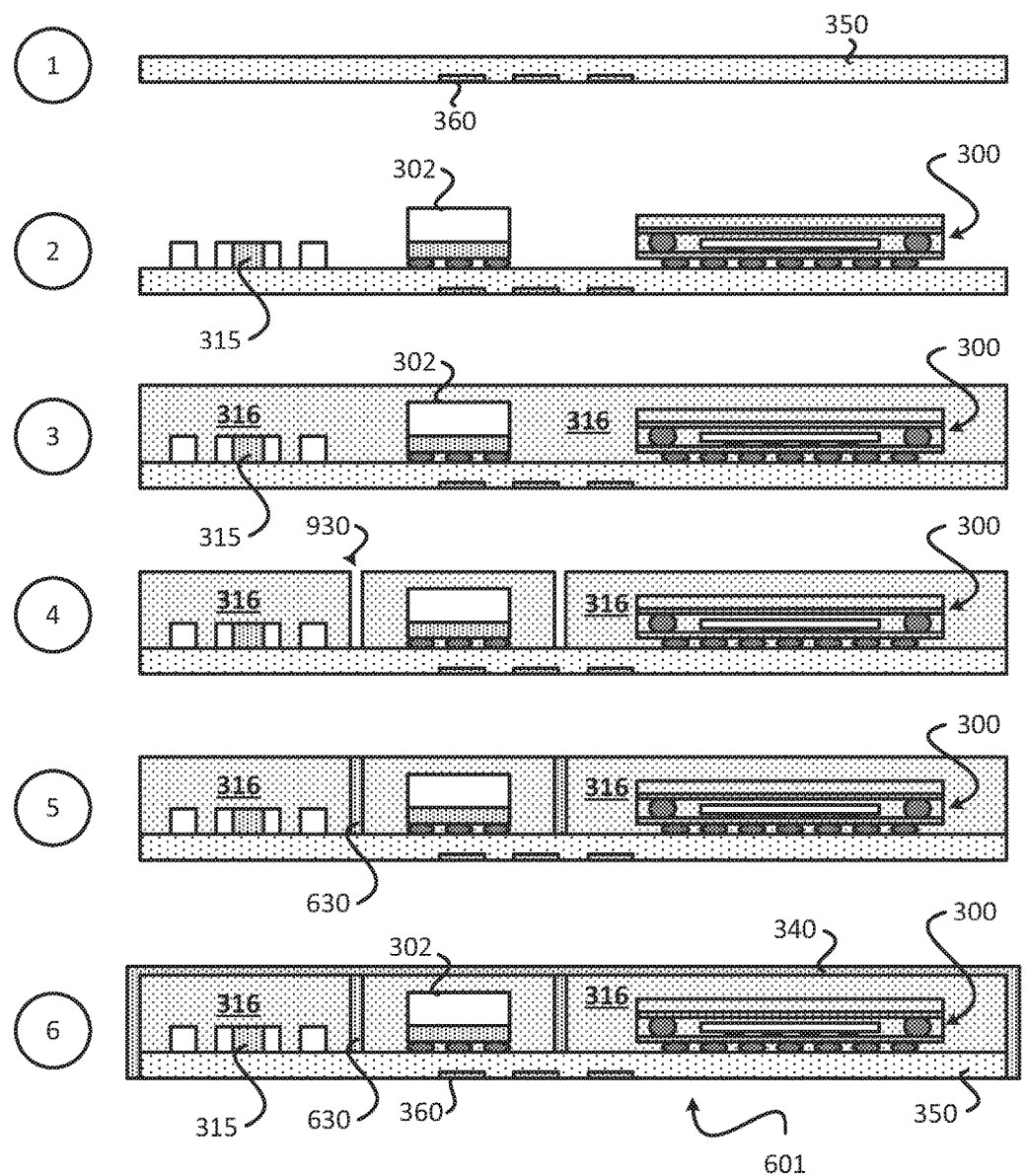
FIG. 9 illustrates an example of a sequence for fabricating another integrated device that includes an embedded a package on package (PoP) device.

Exemplary Sequence for Fabricating an Integrated Device Comprising an Embedded Package on Package (PoP) Device In some implementations, providing/fabricating an integrated device that includes an embedded package on package (PoP) device includes several processes. FIG. 9 illustrates an exemplary sequence for providing/fabricating integrated device that includes an embedded package on package (PoP) device. In some implementations, the sequence of FIG. 9 may be used to fabricate the integrated device that includes an embedded package on package (PoP) device of FIGS. 3-5 and/or other integrated devices described in the present disclosure. FIG. 9 will now be described in the context of providing/fabricating the integrated device of FIG. 6.

It should be noted that the sequence of FIG. 9 may combine one or more stages in order to simplify and/or clarify the sequence for providing integrated device that includes an embedded package on package (PoP) device. In some implementations, the order of the processes may be changed or modified.

Stage 1 illustrates a state after a printed circuit board (PCB) 350 that includes a plurality of interconnects 360 is provided. In some implementations, the printed circuit board (PCB) 350 is provided by a supplier or fabricated.

Stage 2 illustrates the package on package (PoP) device 300 and the passive component 315 coupled to the printed circuit board (PCB) 350. In some implementations, a solder reflow process is used to couple the package on package (PoP) device 300 and the passive component 315 (e.g., through the use of solder interconnects) to the printed circuit board (PCB) 350.

Stage 3 illustrates the encapsulation layer 316 at least partially formed over the package on package (PoP) device 300 and the passive component 315.

Stage 4 illustrates a cavity 1030 formed in the encapsulation layer 316. Different implementations may use different processes to form the cavity 930. A laser process and/or a photo-lithography process may be used to form the cavity 930.

Stage 5 illustrates the cavity 930 filled with a conductive material to form the internal shield 630. Different implementations may use different processes for forming the internal shield 630. In some implementations, a pasting process, a plating process, and/or a sputtering process may be used to fill the cavity 930 to form the internal shield 630.

Stage 6 illustrates the external shield 340 formed over the encapsulation layer 316. As shown at stage 6, the external shield 340 is coupled to the internal shield 630 and the printed circuit board (PCB) 350. In some implementations, stage 6 illustrates the integrated device 501 that includes the package on package (PoP) device 300, the package 302, the passive component 315, the internal shield 630, the encapsulation layer 316, the printed circuit board (PCB) 350, and the external shield 340.

Figure 10:
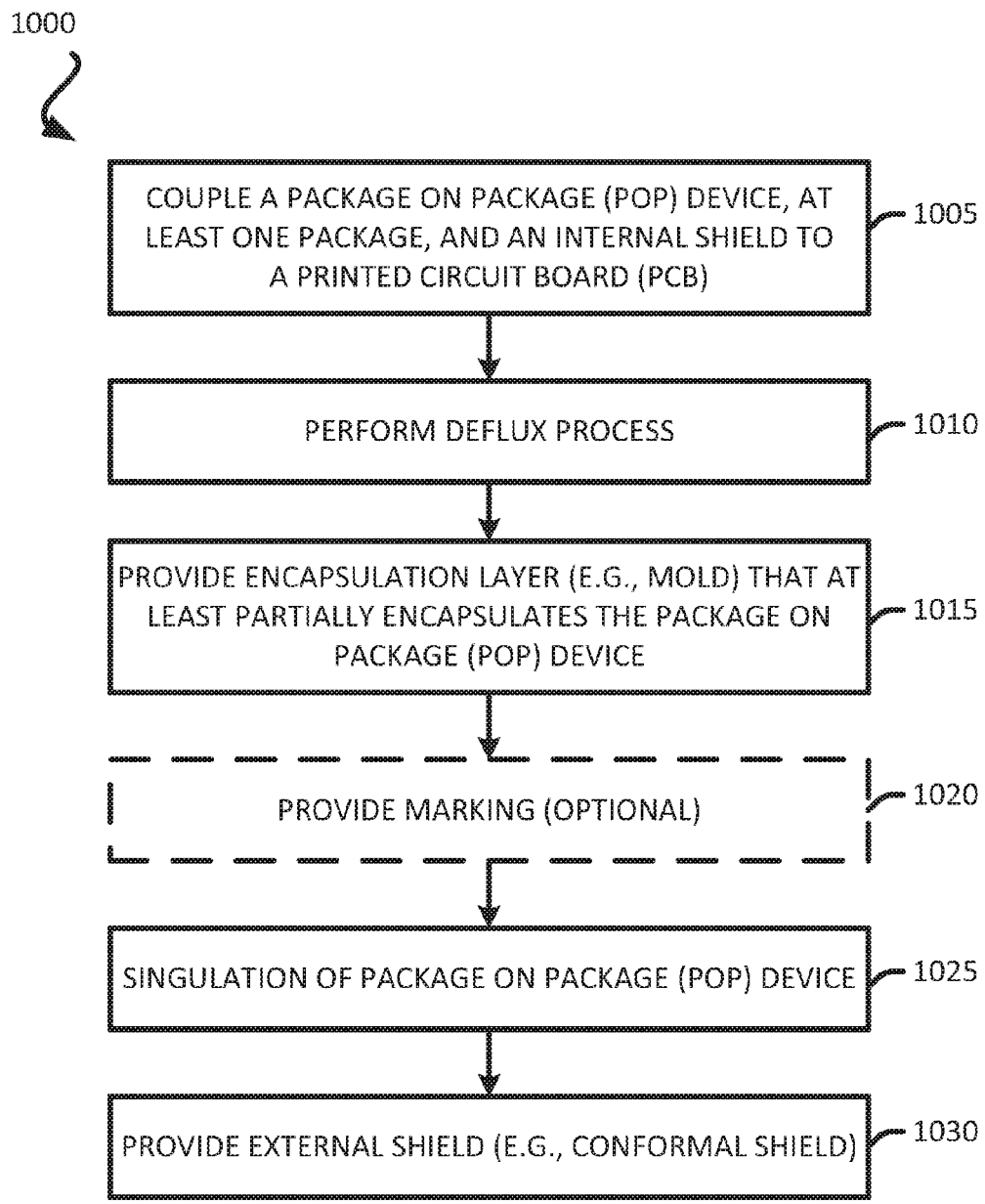
FIG. 10 illustrates a flow diagram of an exemplary method for fabricating an integrated device that includes an embedded a package on package (PoP) device.

Exemplary Method for Fabricating an Integrated Device that Includes an Embedded Package on Package (PoP) Device In some implementations, providing/fabricating an integrated device that includes an embedded package on package (PoP) device includes several processes. FIG. 10 illustrates an exemplary flow diagram of a method 1000 for providing/fabricating integrated device that includes an embedded package on package (PoP) device. In some implementations, the method of FIG. 10 may be used to provide/fabricate the integrated device that includes an embedded package on package (PoP) device of FIGS. 3-7 and/or other integrated devices described in the present disclosure. FIG. 10 will be described in the context of providing/fabricating the device package of FIG. 5.

It should be noted that the flow diagram of FIG. 10 may combine one or more processes in order to simplify and/or clarify the method for providing an integrated device. In some implementations, the order of the processes may be changed or modified.

At stage 1005, a package on package (PoP) device (e.g., 300), at least one package (e.g., 302), and an internal shield (e.g., 330) are coupled to a printed circuit board (PCB) (e.g., 350). Examples of coupling a package on package (PoP) device, at least one package, and an internal shield to a printed circuit board (PCB) are illustrated and described in FIG. 8 (e.g., stage 2 of FIG. 8). A solder reflow process may be used to couple a package on package (PoP) device, at least one package, and an internal shield to (e.g., through a plurality of solder interconnects) a printed circuit board (PCB).

At stage 1010, a deflux process is performed to remove residue that may have accumulated during the coupling of the package on package (PoP) device, the at least one package, and the internal shield to the printed circuit board (PCB).

At stage 1015, an encapsulation layer (e.g., first encapsulation layer 416) that at least partially encapsulates the package on package (PoP) device is provided. In some implementations, the encapsulation layer that is provided may be formed in the package on package (PoP) device. For example, an encapsulation layer (e.g., encapsulation layer 316) that at least partially encapsulates the package on package (PoP) device 500 is formed between a first die 411 of the first package 401 of the package on package (PoP) device 500, and a second package substrate 420 of the second package 402 of the package on package (PoP) device 500.

Optionally, at stage 1020, the package on package (PoP) device may be marked, which may include using a laser to mark portions of the encapsulation layer.

In some implementations, several package on package (PoP) devices are concurrently being fabricated on a wafer. In such instances, at stage 1025, the wafer may be singulated so as to form individual package on package (PoP) devices.

At stage 1030, an external shield over the encapsulation layer is formed. In some implementations, formation of the external shield includes forming a cavity in the encapsulation layer and forming a metal layer over the encapsulation layer to form the external shield. The external shield is formed such that the external shield is coupled to the internal shield. In some implementations, the external shield includes a conformal shield that follows the shape and/or contours of the encapsulation layer. A plating process may be used to form the external shield over the encapsulation layer.

Exemplary Functionalities for Integrated Devices Comprising Embedded Package on Package (PoP) Device As mentioned above, the integrated devices described in the present disclosure may be configured to provide comprehensive mobile functionalities (e.g., cellular functionality, wireless fidelity (WiFi) functionality, Bluetooth functionality, Global Positioning System (GPS) functionality) in a small space and/or form factor, thus allowing the integrated devices to be implemented in small devices, such as, but not limited to, wearable devices, watches, glasses, and Internet of things (IoT) devices, and thus enabling these small devices to have comprehensive mobile functionalities.

For example, in some implementations, the size of the integrated device 301, or any of the integrated devices described in the present disclosure, may be about 30 mm (W)×30 mm (L)×2 mm (H) or less. In some implementations, the size of the integrated device 301, or any of the integrated devices described in the present disclosure, may be about 26 mm (W)×26 mm (L)×1.8 mm (H) or less. In some implementations, the size of the integrated device 301, or any of the integrated devices described in the present disclosure, may be about 52 mm (W)×52 mm (L)×2 mm (H) or less.

Figure 11:
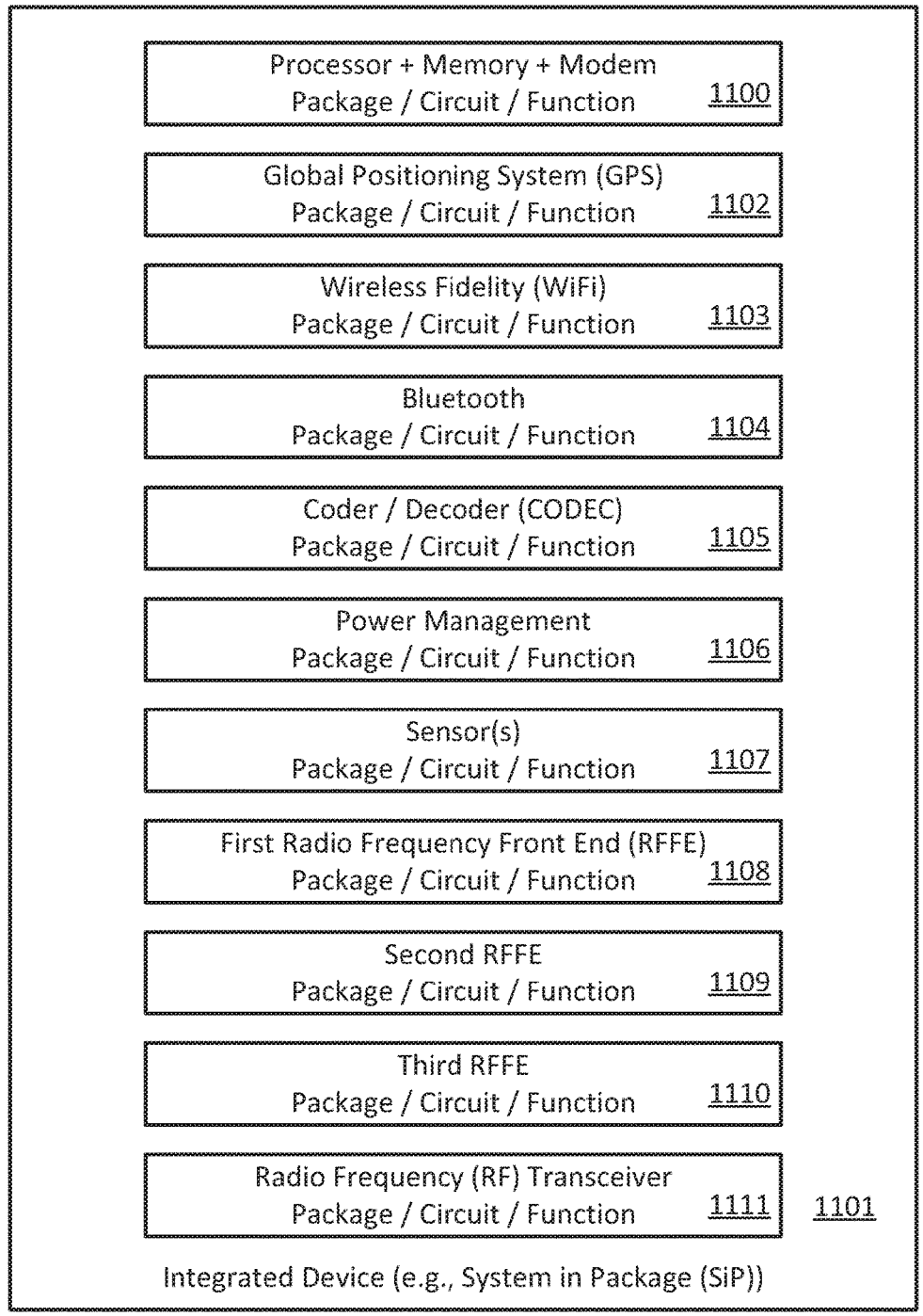
FIG. 11 illustrates packages, circuits, and applications of an integrated device that includes an embedded a package on package (PoP) device.

FIG. 11 illustrates a conceptual illustration of the functionalities an integrated device with an embedded package on package (PoP) may have. As shown in FIG. 11, the integrated device 1101 includes a processor, memory and/or modem function 1100 (e.g., means for processor, memory and modem), a positioning function 1102 (e.g., means for positioning, Global Positioning System (GPS)), a first wireless communication function 1103 (e.g., means for a first wireless communication, WiFi), a second wireless communication function 1104 (e.g., means for a second wireless communication, Bluetooth), a codec function 1105 (e.g., means for coding and/or decoding), a power management function 1106 (e.g., means for power management), at least one sensor function 1107 (e.g., means for sensor), a first radio frequency front end (RFFE) function 1108 (e.g., means for a first RFFE), a second radio frequency front end (RFFE) function 1109 (e.g., means for a second RFFE), a third radio frequency front end (RFFE) function 1110 (e.g., means for a third RFFE), and a radio frequency (RF) transceiver function 1111 (e.g., means for a RF transceiving).

Examples of RFFE functions include Global System for Mobile Communications (GSM), Wideband Code Division Multiple Access (WCDMA), Frequency Division Duplex Long-Term Evolution (FDD-LTE), Time Division Duplex Long-Term Evolution (TDD-LTE). Each of the above examples of an RFFE function may include one or more different bands.

In some implementations, the above functions may be implemented in one or more packages 302-311 (e.g., electronic package components) and/or the package on package (PoP) device 300. Thus, for example, the processor, memory and modem function 1100 may be a processor, memory and modem package. In some implementations, the above functions may be implemented as one or more circuits in one or more packages 302-311 and/or the package on package (PoP) device 300. For example, the processor, memory and modem function 1100 may be implemented in the package on package (PoP) device 300 that includes a first package 401 and a second package 402. In some implementations, the processor function may be implemented in the first die 411 of the first package 401, and the memory function may be implemented in the second die 421 of the second package 402. In some implementations, one or more of the above functions (e.g., 1100-1111) may be combined in a single package, circuit and/or multiple packages and/or circuits. Different implementations may combine different functions with different packages and/or circuits (e.g., Bluetooth function may be combined with the WiFi function in a single package or circuit). Other implementations may include other functions. For example, a modem function (e.g., means for modem) may be implemented as a separate function or part of another function. In some implementations, the modem function may be part of the processor and memory function or part of other functions.

Having described an integrated device that includes an embedded a package on package (PoP) device, where the integrated device may include several mobile functionalities (e.g., cellular functionality, WiFi functionality, Bluetooth functionality, GPS functionality), various examples of package on package (PoP) devices will now be described below.

Exemplary Package on Package (PoP) Device Comprising a Gap Controller

Figure 12:
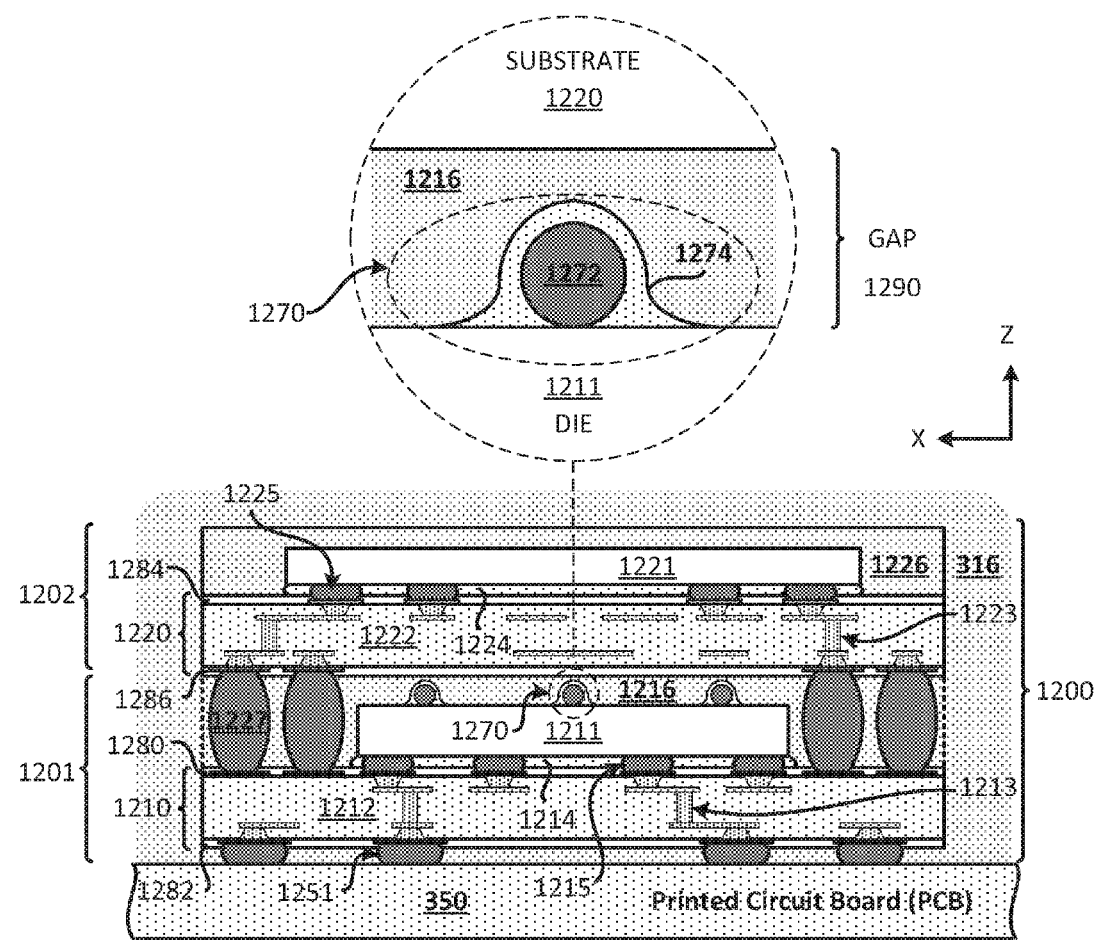
FIG. 12 illustrates a cross-sectional view of a package on package (PoP) device that includes a gap controller.

FIG. 12 illustrates a package on package (PoP) device 1200 that includes a first package 1201, a second package 1202, and a gap controller 1270. The second package 1202 is coupled to the first package 1201. The first package 1201 may be a first integrated circuit (IC) package, and the second package 1202 may be a second integrated circuit (IC) package. The package on package (PoP) device 1200 is coupled to the printed circuit board (PCB) 350 through a plurality of solder balls 1251. The package on package (PoP) device 1200 may be embedded in any of the integrated devices described in the present disclosure.

In some implementations, the gap controller 1270 is located between the first package 1201 and the second package 1202. In some implementations, the gap controller 1270 is located between an electronic package component (e.g., first die 1211) of the first package 1201 and the second package 1202.

As will be further described below, in some implementations, the gap controller 1270 is configured to provide mechanical support, mechanical stability for the second package 1202 (e.g., second package substrate 1220 of the second package 1202). Thus, in some implementations, the gap controller 1270 may be configured to operate as a back stop that minimizes or reduces or any warpage, deformation and/or deflection in a second package (e.g., second package 1202). In some implementations, the gap controller 1270 may include one or more material that is electrically conductive. However, the gap controller 1270 is configured to not provide an electrical path for an electrical signal.

In some implementations, the gap controller 1270 is configured to ensure that there is enough distance, space or gap between a die of the first package 1201, and a package substrate of the second package 1202, so that an encapsulation layer can be provided (e.g., formed) in the space or the gap between the die of the first package 1201, and the package substrate of the second package 1202. The gap controller 1270 may be optional.

The first package 1201 includes a first package substrate 1210, a first die 1211, a first underfill 1214, a plurality of first solder balls 1215, a first encapsulation layer 1216, and the gap controller 1270. In some implementations, the first package 1201 may also include a plurality of package interconnects 1227.

The first package substrate 1210 includes at least one dielectric layer 1212, a plurality of first interconnects 1213 (e.g., plurality of first substrate interconnects), a first solder resist layer 1280 and a second solder resist layer 1282. The plurality of first interconnects 1213 may include traces, vias and/or pads. The first package substrate 1210 is coupled to the printed circuit board (PCB) 350 through the plurality of solder balls 1251. More specifically, the plurality of first interconnects 1213 is coupled to the plurality of solder balls 1251.

The first die 1211 may be an integrated circuit (IC) that includes a plurality of transistors and/or other electronic components. The first die 1211 may be a logic die and/or a memory die. The first die 1211 may be a bare die. The first die 1211 is coupled to the first package substrate 1210 through the plurality of first solder balls 1215. The first underfill 1214 is located between the first die 1211 and the first package substrate 1210. The first underfill 1214 may at least partially surround at least some of the plurality of first solder balls 1215.

The first encapsulation layer 1216 at least partially encapsulates the first die 1211, the gap controller 1270, and the plurality of package interconnects 1227. Different implementations may use different materials for the first encapsulation layer 1216. For example, the first encapsulation layer 1216 may include a mold and/or an epoxy fill.

The second package 1202 includes a second package substrate 1220, a second die 1221, a second underfill 1224, a plurality of second solder balls 1225, and a second encapsulation layer 1226. In some implementations, the second package 1202 may also include the plurality of package interconnects 1227.

The second package substrate 1220 includes at least one dielectric layer 1222, a plurality of second interconnects 1223 (e.g., plurality of second substrate interconnects), a first solder resist layer 1284 and a second solder resist layer 1286. The plurality of second interconnects 1223 may include traces, vias and/or pads.

The second die 1221 may be an integrated circuit (IC) that includes a plurality of transistors and/or other electronic components. The second die 1221 may be a logic die and/or a memory die. The second die 1221 may be a bare die. The second die 1221 is coupled to the second package substrate 1220 through the plurality of second solder balls 1225. The second underfill 1224 is located between the second die 1221 and the second package substrate 1220. The second underfill 1224 may at least partially surround at least some of the plurality of second solder balls 1225.

The second encapsulation layer 1226 at least partially encapsulates the second die 1221. Different implementations may use different materials for the second encapsulation layer 1226. For example, the second encapsulation layer 1226 may include a mold and/or an epoxy fill.

The second package 1202 is coupled to the first package 1201 through the plurality of package interconnects 1227. The plurality of package interconnects 1227 may include a solder interconnect (e.g., solder ball). The plurality of package interconnects 1227 is coupled to the first package substrate 1210 and the second package substrate 1220. More specifically, the plurality of package interconnects 1227 is coupled to the plurality of the first interconnects 1213 (of the first package substrate 1210) and the plurality of second interconnects 1223 (of the second package substrate 1220).

The gap controller 1270 may be a means for gap control configured to provide a minimum gap between a first die (e.g., first die 1211) and a second package (e.g., the second package 1202). The gap controller 1270 is located over the first die 1211 (e.g., over a back side surface of the first die 1211). In particular, the gap controller 1270 is located between the first die 1211 and the second package substrate 1220 of the second package 1202. In some implementations, the gap controller 1270 is configured to provide a minimum distance, a minimum space, and/or a minimum gap between the first die 1211 of the first package 1201, and the second package substrate 1220 of the second package 1202. In some implementations, the minimum distance, the minimum space, and the minimum gap ensures that there is enough room for the first encapsulation layer 1216 to flow (e.g., during a fabrication process) between the first die 1211 of the first package 1201, and the second package substrate 1220 of the second package 1202, even when there is warpage, deformation, and/or deflection of the second package substrate 1220. Thus, in some implementations, at least one gap controller 1270 that is located over the first die 1211 (e.g., over a back side surface of the first die 1211) ensures that a sufficient amount of the first encapsulation layer 1216 is formed between the first die 1211 and the second package substrate 1220 (of the second package 1202).

FIG. 12 illustrates that the package on package (PoP) device 1200 is at least partially encapsulated by the encapsulation layer 316. The encapsulation layer 316 may be the second encapsulation layer of the package on package (PoP) device 1200. The encapsulation layer 316 may be distinct and separate from the first encapsulation layer 1216 in some implementations. In some implementations, the encapsulation layer 316 may include the first encapsulation layer 1216. In some implementations, the encapsulation layer 316 is the same as the first encapsulation layer 1216. Thus, in some implementations, the encapsulation layer 316 may both encapsulate the package on package (PoP) device 1200 and be located inside the package on package (PoP) device 1200. The above concept is illustrated in FIG. 12 by the dashed boundary (e.g., line) between the encapsulation layer 316 and the first encapsulation layer 1216. It is noted that the boundary (e.g., dashed lines) between the encapsulation layer 316 (e.g., second encapsulation layer) and the first encapsulation layer 1216 is merely exemplary. Different implementations may have different boundary shapes and sizes between the encapsulation layer 316 (e.g., second encapsulation layer) and the first encapsulation layer 1216.

In some implementations, one or more of the gap controller 1270, individually or collectively, may occupy less than substantially all of a space between a first die (e.g., first die 1211) and a second package (e.g., second package 1202). In some implementations, one or more of the gap controller 1270, individually or collectively, is coupled to less than substantially all of a back side surface of a first die (e.g., first die 1211). In some implementations, one or more of the gap controller 1270, individually or collectively, is coupled to less than a majority of a back side surface of a first die (e.g., first die 1211).

The distance, space or gap between the first die 1211 (e.g., top surface of the first die 1211) and the second package 1202 (e.g., bottom surface of the second package substrate 1220) may vary with different implementations. In some implementations, the gap 1290 may be about 10 microns (µm) or more. In some implementations, the gap controller 1270 has a height and/or thickness of about 10-100 microns (µm) or less.

In some implementations, the gap controller 1270 ensures that the minimum gap (e.g., gap 1290) between the first die 1211 (e.g., back side surface of the first die 1211) and the second package 202 (e.g., bottom surface of the second package substrate 1220) is about 10 microns (µm) or greater. In some implementations, the gap controller 1270 eliminates, reduces and/or minimizes a void between the first die 1211 and the second package substrate 1220, thereby providing a more robust and reliable package on package (PoP) device 1200. Thus, the gap controller 1270 is configured to allow the first encapsulation layer 1216 to fill the space (e.g., to at least fill a majority or a substantial part of the space) between the first die 1211 and the second package substrate 1220. Moreover, the gap controller 1270 is configured to not substantially impede the flow of the first encapsulation layer 1216 (e.g., during a fabrication process), when the first encapsulation layer 1216 is formed. An example of how the first encapsulation layer 1216 is formed is further described below in FIG. 122. Thus, the use of one or more of the gap controller 1270 provides an effective and counter intuitive approach to ensure that the first encapsulation layer 1216 can flow between the first die 1211 and the second package substrate 1220, during a fabrication process of the package on package (PoP) device 1200.

Different implementations may position the gap controller 1270 over different portions of the first die 1211. In some implementations, the greatest amount of warpage, deformation, and/or deflection of the second package substrate 1220 may occur in a space above a center of the first die 1211, a center of the first package 1201 and/or a center of the second package 1202. In some implementations, the gap controller 1270 may be positioned on or about (e.g., near) a center of the first die 1211, to ensure that there is support in a portion of the second package substrate 1220 that may potentially have the greatest amount of warpage, deformation and/or deflection.

FIG. 12 illustrates that the gap controller 1270 includes a spacer 1272 and an adhesive layer 1274. The adhesive layer 1274 at least partially surrounds the spacer 1272. Different implementations may use different materials for the spacer 1272 and the adhesive layer 1274. In some implementations, the spacer 1272 may be a metal ball (e.g., copper ball). The adhesive layer 1274 may be used to couple the spacer 1272 to the first die 1211. In some implementations, the adhesive layer 1274 may be configured to prevent the gap controller 1270 from substantially moving when the first encapsulation layer 1216 is formed between the first die 1211 and the second package 1202.

The spacer 1272 may include a solid spacer that includes a ceramic, a metal, and/or a polymer (e.g., copper, a polymer core ball and/or polymer post). The adhesive layer 1274 may include an underfill and/or a high viscosity corner fill material (e.g., Cookson HEL-30, Namics G8345D) and RTV silicon (e.g., ASE 600). The adhesive layer 1274 may include a sintering paste (e.g., Ormet 406, CS650).

As shown in FIG. 12, the first encapsulation layer 1216 at least partially surrounds the adhesive layer 1274 and/or the spacer 1272. FIG. 12 also illustrates that the gap controller 1270 is in direct physical contact with the first die 1211, but not in direct physical contact with the second package 1202 (e.g., second package substrate 1220 of the second package 1202). In some implementations, the gap controller 1270 may be in direct physical contact with both the first die 1211 and the second package 1202 (e.g., second package substrate 1220 of the second package 1202). In some implementations, the gap controller 1270 may be in direct physical contact with the second package 1202 (e.g., second package substrate 1220 of the second package 1202), but not in direct contact with the first die 1211.

The present disclosure illustrates and describes solder balls (e.g., 1215, 1225) being used to couple the dies (e.g., 1211, 1221) to the package substrates (e.g., 1210, 1220). However, in some implementations, other interconnects may be used to couple the dies to the package substrates. For examples, some implementations may use wire bonding and pillars (e.g., copper pillars) to couple dies to a package substrate.

As mentioned above, different implementations may use different configurations of the gap controller 1270. For example, different implementations may use different numbers of the gap controller 1270. Moreover, the gap controller 1270 may be located differently over the first die 1211 (e.g., on or about the center of the first die 1211). In some implementations, the gap controller 1270 may include different structures and/or materials.

Figure 13:
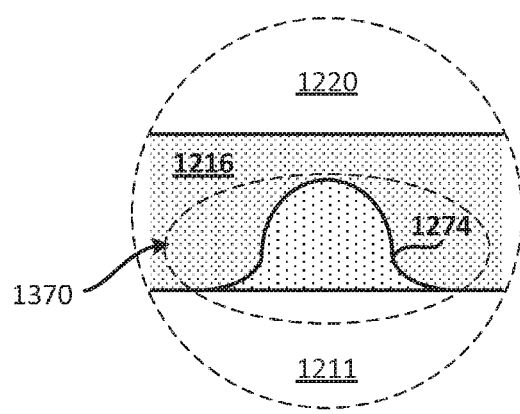
FIG. 13 illustrates an example of a gap controller.

FIG. 13 illustrates a gap controller 1370 that includes the adhesive layer 1274. The adhesive layer 1274 is formed over the first die 1211, and is at least partially surrounded by the first encapsulation layer 1216.

Figure 14:
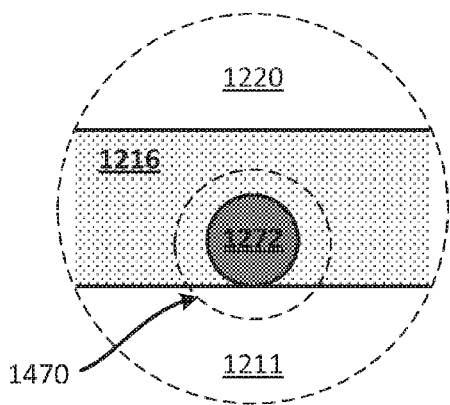
FIG. 14 illustrates another example of a gap controller.

FIG. 14 illustrates a gap controller 1470 that includes the spacer 1272. The spacer 1272 is formed over the first die 1211, and is at least partially surrounded by the first encapsulation layer 1216.

Figure 15:
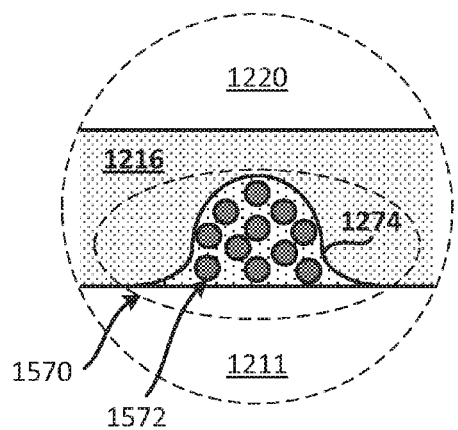
FIG. 15 illustrates another example of a gap controller.

FIG. 15 illustrates a gap controller 1570 that includes a plurality of spacers 1572 and the adhesive layer 1274. The plurality of spacers 1572 is at least partially surrounded by the adhesive layer 1274. The plurality of spacers 1572 and adhesive layer 1274 are formed over the first die 1211, and are at least partially surrounded by the first encapsulation layer 1216.

As shown in the present disclosure, the gap controllers (e.g., 1270, 1370, 1470, 1570) are coupled to a first package (e.g., first package 1201), but free from coupling to a second package (e.g., second package 1202). In some implementations, the gap controllers (e.g., 1270, 1370, 1470, 1570) may physically touch a second package, but are not permanently bonded to a second package. For example, the gap controllers may be bonded to the first package but not bonded to (e.g., free from bonding with) the second package.

The gap controllers 1370, 1470 and/or 1570 may be means for gap control for providing a minimum gap between a first die (e.g., first die 1211) and a second package (e.g., the second package 1202). In some implementations, one or more of the gap controllers 1370, 1470, 1570 may occupy less than substantially all of a space between a first die (e.g., first die 1211) and a second package (e.g., second package 1202). In some implementations, one or more of the gap controllers 1370, 1470, and/or 1570, individually or collectively, is coupled to less than substantially all of a back side surface of a first die (e.g., first die 1211). In some implementations, one or more of the gap controllers 1370, 1470, and/or 1570, individually or collectively, is coupled to less than a majority of a back side surface of a first die (e.g., first die 1211).

The dimensions as described for the gap controller 1270 may be applicable to the dimensions for the gap controllers 1370, 1470, and/or 1570. Moreover, the gap controllers 1370, 1470, and/or 1570 may be implemented in any of the package on package (PoP) devices described in the present disclosure. Different implementations may include different configurations and/or combinations of the package on package (PoP) devices that includes a gap controller. Below are further examples of different package on package (PoP) devices that include a gap controller.

Exemplary Package on Package (PoP) Device Comprising a Gap Controller

Figure 16:
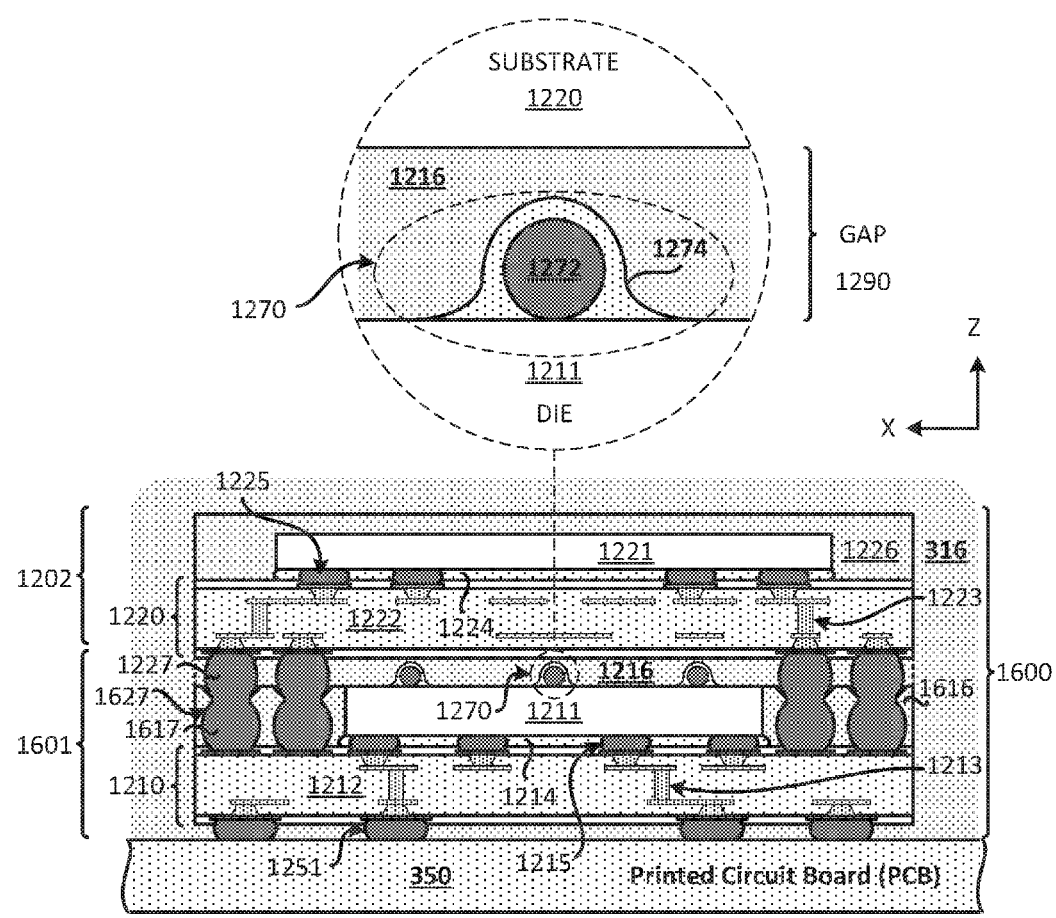
FIG. 16 illustrates a cross-sectional view of another package on package (PoP) device that includes a gap controller.

FIG. 16 illustrates another package on package (PoP) device 1600 that includes a first package 1601, the second package 1202, and the gap controller 1270. The second package 1202 is coupled to the first package 1601. The first package 1601 may be a first integrated circuit (IC) package.

The package on package (PoP) device 1600 is coupled to a printed circuit board (PCB) 350 through the plurality of solder balls 1251. The package on package (PoP) device 1600 is similar to the package on package (PoP) device 1200, except that the first package 1601 has a different configuration. The package on package (PoP) device 1600 may be embedded in any of the integrated devices described in the present disclosure.

As described above and further described below, in some implementations, the gap controller 1270 is configured to ensure that there is enough distance, space or gap between a die of the first package 1601, and a package substrate of the second package 1202, so that an encapsulation layer can be provided (e.g., formed) in the space or the gap between the die of the first package 1601, and the package substrate of the second package 1202. The gap controller 1270 may be optional.

The first package 1601 includes the first package substrate 1210, the first die 1211, the first underfill 1214, the plurality of first solder balls 1215, the first encapsulation layer 1216, the gap controller 1270, and an encapsulation layer 1616. Thus, the first package 1601 includes two encapsulation layers (e.g., 1216, 1616). In some implementations, the first package 1601 may also include a plurality of package interconnects 1627. The plurality of package interconnects 1627 may include a plurality of package interconnects 1617 and the plurality of package interconnects 1227.

The encapsulation layer 1616 at least partially encapsulates the first die 1211 and the plurality of package interconnects 1627. For example, the encapsulation layer 1616 may at least partially encapsulate the first die 1211 and the plurality of package interconnects 1617. In some implementations, a surface of the encapsulation layer 1616 may be substantially co-planar with a surface (e.g., back side surface) of the first die 1211. The first encapsulation layer 1216 is formed over the first die 1211 and the encapsulation layer 1616. The encapsulation layer 1616 may be the same material or a different material as the first encapsulation layer 1216. The first encapsulation layer 1216 at least partially encapsulates the gap controller 1270 and the plurality of package interconnects 1627.

The second package 1202 includes the second package substrate 1220, the second die 1221, the second underfill 1224, the plurality of second solder balls 1225, and the second encapsulation layer 1226. In some implementations, the second package 1202 may also include the plurality of package interconnects 1627, which includes the plurality of package interconnects 1617 and the plurality of package interconnects 1227.

The second package 1202 is coupled to the first package 1601 through the plurality of package interconnects 1627, which includes the plurality of package interconnects 1227 and the plurality of package interconnects 1617. The plurality of package interconnects 1627 may include a solder interconnect (e.g., solder ball). The plurality of package interconnects 1627 is coupled to the first package substrate 1210 and the second package substrate 1220. In particular, the plurality of package interconnects 1627 is coupled to the plurality of the first interconnects 1213 (of the first package substrate 1210) and the plurality of second interconnects 1223 (of the second package substrate 1220). In some implementations, the plurality of package interconnects 1227 is coupled to the plurality of second interconnects 1223 and the plurality of package interconnects 1617. The plurality of package interconnects 1617 is coupled to the plurality of first interconnects 1213.

FIG. 16 illustrates that the package on package (PoP) device 1600 is at least partially encapsulated by the encapsulation layer 316. The encapsulation layer 316 may be distinct and separate from the first encapsulation layer 1216 in some implementations. In some implementations, the encapsulation layer 316 may include the first encapsulation layer 1216. In some implementations, the encapsulation layer 316 is the same as the first encapsulation layer 1216. Thus, in some implementations, the encapsulation layer 316 may both encapsulate the package on package (PoP) device 1600 and be located inside the package on package (PoP) device 1600. The above concept is illustrated in FIG. 16 by the dashed boundary (e.g., line) between the encapsulation layer 316 and the first encapsulation layer 1216.

The gap controller 1270 is located over the first die 1211 (e.g., over a top surface of the first die 1211). In particular, the gap controller 1270 is located between the first die 1211 of the first package 1601, and the second package substrate 1220 of the second package 1202. In some implementations, the gap controller 1270 is configured to provide a minimum distance, a minimum space, and/or a minimum gap between the first die 1211 of the first package 1601, and the second package substrate 1220 of the second package 1202. In some implementations, the minimum distance, the minimum space, the minimum gap ensures that there is enough room for the first encapsulation layer 1216 to flow (e.g., during a fabrication process) between the first die 1211 of the first package 1601, and the second package substrate 1220 of the second package 1202, even when there is warpage, deformation, and/or deflection of the second package substrate 1220. Thus, in some implementations, at least one gap controller 1270 that is located over the first die 1211 (e.g., over a top surface of the first die 1211) ensures that a sufficient amount of the first encapsulation layer 1216 is formed between the first die 1211 and the second package substrate 1220 (of the second package 1202).

Exemplary Package on Package (PoP) Device Comprising a Gap Controller

Figure 17:
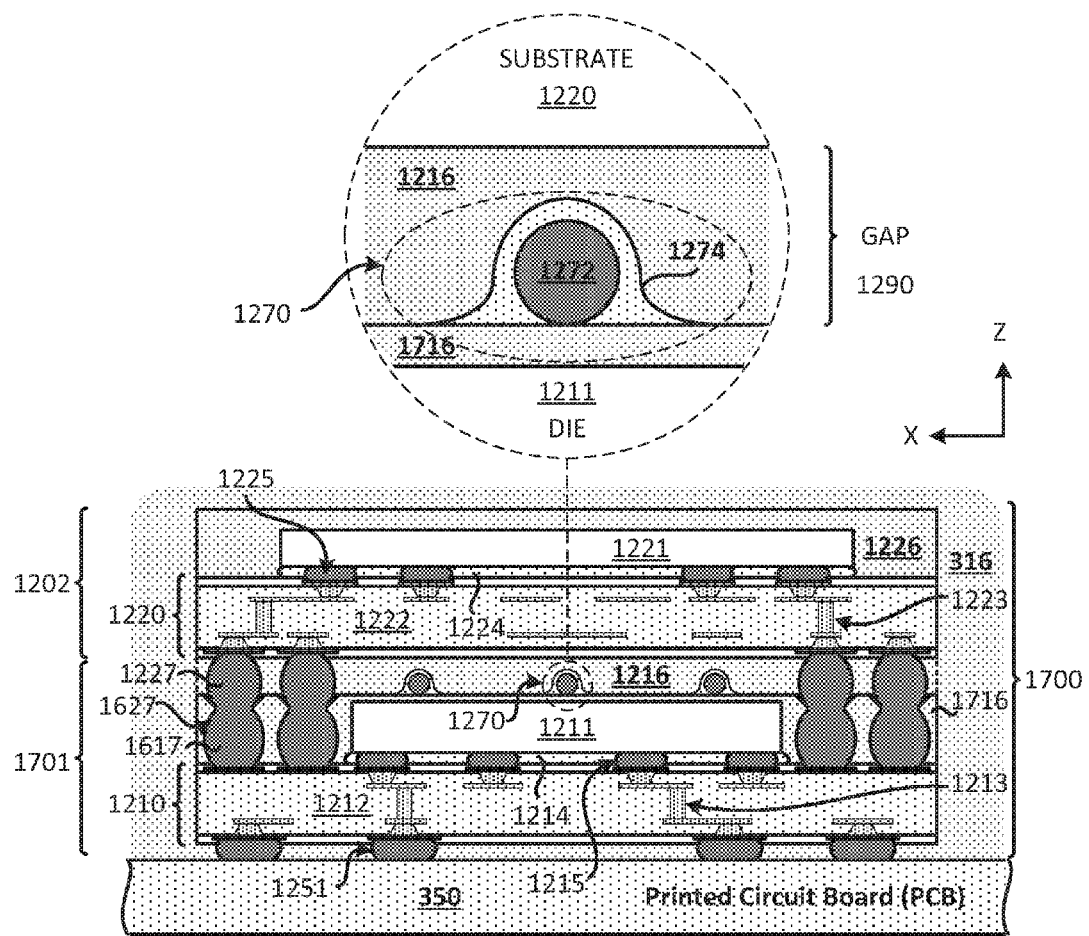
FIG. 17 illustrates a cross-sectional view of another package on package (PoP) device that includes a gap controller.

FIG. 17 illustrates another package on package (PoP) device 1700 that includes a first package 1701, the second package 1202, and the gap controller 1270. The second package 1202 is coupled to the first package 1701. The first package 1701 may be a first integrated circuit (IC) package. The package on package (PoP) device 1700 is coupled to a printed circuit board (PCB) 350 through the plurality of solder balls 1251. The package on package (PoP) device 1700 is similar to the package on package (PoP) device 1600, except that the first package 1701 has a different configuration. In particular, the first package 1701 includes two encapsulation layers where one encapsulation layer is over molded over the first die 1211 of the first package 1701. The package on package (PoP) device 1700 may be embedded in any of the integrated devices described in the present disclosure.

As described above and further described below, in some implementations, the gap controller 1270 is configured to ensure that there is enough distance, space or gap between a die of the first package 1701, and a package substrate of the second package 1202, so that an encapsulation layer can be provided (e.g., formed) in the space or the gap between the die of the first package 1701, and the package substrate of the second package 1202. The gap controller 1270 may be optional.

The first package 1701 includes the first package substrate 1210, the first die 1211, the first underfill 1214, the plurality of first solder balls 1215, the first encapsulation layer 1216, the gap controller 1270, and an encapsulation layer 1716. Thus, the first package 1701 includes two encapsulation layers (e.g., 1216, 1716). In some implementations, the first package 1701 may also include the plurality of package interconnects 1627. The plurality of package interconnects 1627 may include the plurality of package interconnects 1617 and the plurality of package interconnects 1227.

The encapsulation layer 1716 at least partially encapsulates the first die 1211 and the plurality of package interconnects 1627. In particular, the encapsulation layer 1716 is over molded over the first die 1211. That is, the encapsulation layer 1716 encapsulates a surface (e.g., back side surface) of the first die 1211. Thus, a surface of the encapsulation layer 1716 is not substantially co-planar with a surface (e.g., back side surface) of the first die 1211. The first encapsulation layer 1216 at least partially encapsulates the gap controller 1270 and the plurality of package interconnects 1627. The first encapsulation layer 1216 is formed over the encapsulation layer 1716. The encapsulation layer 1716 may be the same material or a different material as the first encapsulation layer 1216.

FIG. 17 illustrates that the package on package (PoP) device 1700 is at least partially encapsulated by the encapsulation layer 316. The encapsulation layer 316 may be distinct and separate from the first encapsulation layer 1216 in some implementations. In some implementations, the encapsulation layer 316 may include the first encapsulation layer 1216. In some implementations, the encapsulation layer 316 is the same as the first encapsulation layer 1216. Thus, in some implementations, the encapsulation layer 316 may both encapsulate the package on package (PoP) device 1700 and be located inside the package on package (PoP) device 1700. The above concept is illustrated in FIG. 17 by the dashed boundary (e.g., line) between the encapsulation layer 316 and the first encapsulation layer 1216.

As shown in FIG. 17, the gap controller 1270 is located over the encapsulation layer 1716. In particular, the gap controller 1270 is located between the first die 1211 of the first package 1701, and the second package substrate 1220 of the second package 1202. In some implementations, the gap controller 1270 is configured to provide a minimum distance, a minimum space, and/or a minimum gap between the encapsulation layer 1716 over the first die 1211 of the first package 1701, and the second package substrate 1220 of the second package 1202. In some implementations, the minimum distance, the minimum space, the minimum gap ensures that there is enough room for the first encapsulation layer 1216 to flow (e.g., during a fabrication process) between the encapsulation layer 1716 over first die 1211 of the first package 1701, and the second package substrate 1220 of the second package 1202, even when there is warpage, deformation, and/or deflection of the second package substrate 1220. Thus, in some implementations, at least one gap controller 1270 that is located over the encapsulation layer 1716 on the first die 1211 ensures that a sufficient amount of the first encapsulation layer 1216 is formed between the encapsulation layer 1716 over the first die 1211 and the second package substrate 1220 (of the second package 1202).

FIG. 17 illustrates that the gap controller 1270 is not in direct physical contact with the first die 1211 nor the second package 1202 (e.g., second package substrate 1220 of the second package 1202). FIG. 17 also illustrates that the gap controller 1270 is configured to provide a gap 1290 (e.g., minimum gap) between the encapsulation layer 1716 over the first die 1211, and the second package 1202 (e.g., bottom surface of the second package substrate 1220 of the second package 1202). In some implementations, a gap between the first die 1211 and the second package 1202 (e.g., second package substrate 1220 of the second package 1202) may include the gap 1290 and a thickness of the encapsulation layer 1716 over the first die 1211.

Exemplary Package on Package (PoP) Device Comprising a Gap Controller

Figure 18:
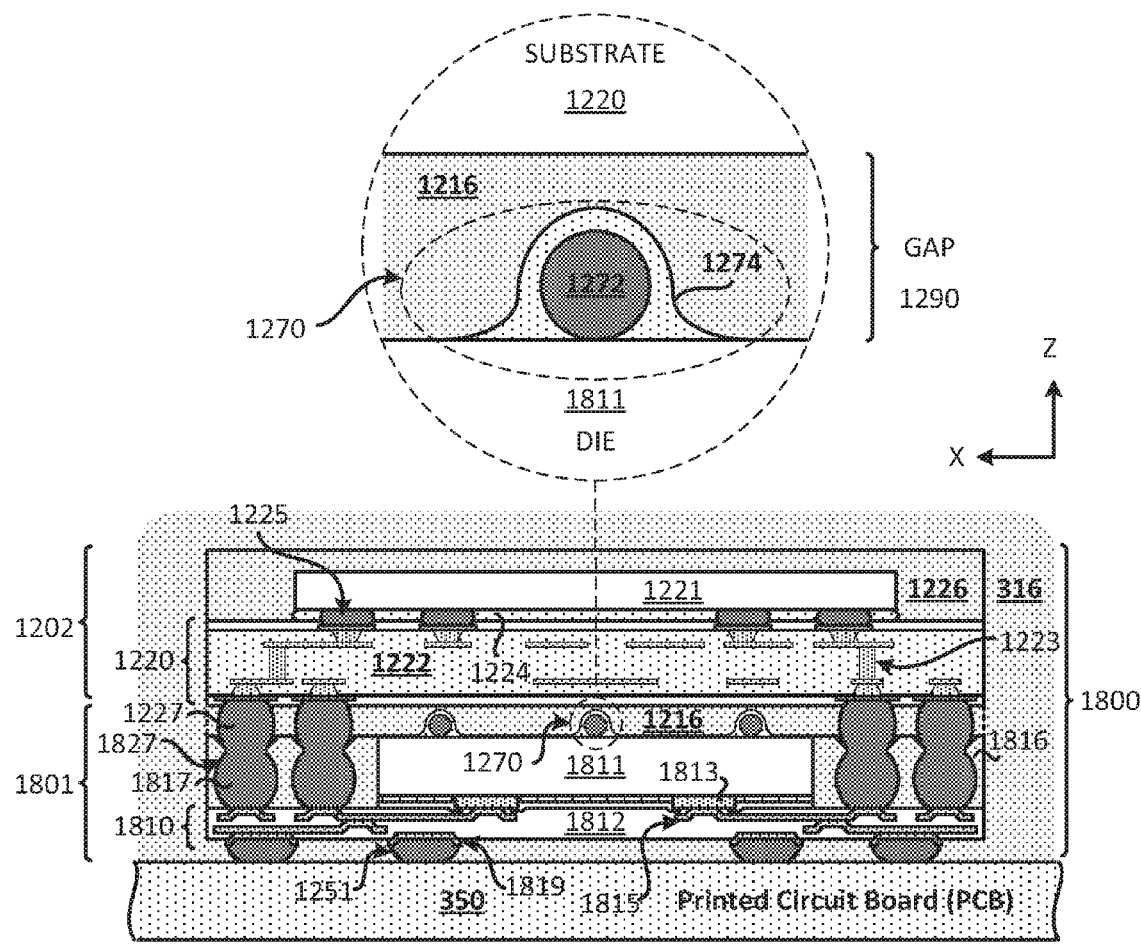
FIG. 18 illustrates a cross-sectional view of another package on package (PoP) device that includes a gap controller.

FIG. 18 illustrates another package on package (PoP) device 1800 that includes a first package 1801, the second package 1202, and the gap controller 1270. The second package 1202 is coupled to the first package 1801. The package on package (PoP) device 1800 is coupled to a printed circuit board (PCB) 350 through the plurality of solder balls 1251. The package on package (PoP) device 1800 is similar to the package on package (PoP) device 1600, except that the first package 1801 has a different configuration. In particular, the first package 1801 includes a wafer level package (WLP). The package on package (PoP) device 1800 may be embedded in any of the integrated devices described in the present disclosure.

As described above and further described below, in some implementations, the gap controller 1270 is configured to ensure that there is enough distance, space or gap between a die of the first package 1801, and a package substrate of the second package 1202, so that an encapsulation layer can be provided (e.g., formed) in the space or the gap between the die of the first package 1801, and the package substrate of the second package 1202. The gap controller 1270 may be optional.

The first package 1801 may include a fan out wafer level package (FOWLP). The first package 1801 includes a first redistribution portion 1810, a first die 1811, a first encapsulation layer 1216, and an encapsulation layer 1816. The first redistribution portion 1810 may be a fan out portion (e.g. for fanning or routing of signaling to and from devices with different I/O pitches). The first package 1801 may also include the plurality of package interconnects 1827. The plurality of package interconnects 1827 may include a plurality of package interconnects 1817 and the plurality of package interconnects 1227. The plurality of package interconnects 1827 may include a solder interconnect (e.g., solder ball).

The first redistribution portion 1810 includes at least one dielectric layer 1812, at least one redistribution layer 1815, and at least one underbump metallization (UBM) layer 1819. A redistribution layer (e.g. 1815) may redistribute signaling from I/O pads of a die to other parts of the package. The at least one redistribution layer 1815 is coupled to the at least one UBM layer 1819. The at least one UBM layer 1819 is coupled to the plurality of solder balls 1251. In some implementations, the at least one UBM layer 1819 may be optional. In such instances, the plurality of solder balls 1251 may be coupled to the at least one redistribution layer 1815.

The first die 1811 may be an integrated circuit (IC) that includes a plurality of transistors and/or other electronic components. The first die 1811 may be a logic die and/or a memory die. The first die 1811 may be a bare die. The first die 1811 may include the pad 1813. The first die 1811 is coupled to the first redistribution portion 1810. In particular, the pad 1813 of the first die 1811 is coupled to the at least one redistribution layer 1815.

The encapsulation layer 1816 at least partially encapsulates the first die 1811 and the plurality of package interconnects 1827. For example, the encapsulation layer 1816 may at least partially encapsulate the first die 1811 and the plurality of package interconnects 1817. In some implementations, a surface of the encapsulation layer 1816 may be substantially co-planar with a surface (e.g., back side surface) of the first die 1811. The first encapsulation layer 1216 is formed over the first die 1811 and the encapsulation layer 1816. The encapsulation layer 1816 may be the same material or a different material as the first encapsulation layer 1216. The first encapsulation layer 1216 at least partially encapsulates the gap controller 1270 and the plurality of package interconnects 1827.

The second package 1202 is coupled to the first package 1801 through the plurality of package interconnects 1827, which includes the plurality of package interconnects 1227 and the plurality of package interconnects 1817. The plurality of package interconnects 1827 may include a solder interconnect (e.g., solder ball). The plurality of package interconnects 1827 is coupled to the first redistribution portion 1810 and the second package substrate 1220. In particular, the plurality of package interconnects 1827 is coupled to the at least one redistribution layer 1815 (of the first redistribution portion 1810) and the plurality of second interconnects 1223 (of the second package substrate 1220). In some implementations, the plurality of package interconnects 1227 is coupled to the plurality of second interconnects 1223 and the plurality of package interconnects 1817. The plurality of package interconnects 1817 is coupled to the at least one redistribution layer 1815 of the first redistribution portion 1810.

FIG. 18 illustrates that the package on package (PoP) device 1800 is at least partially encapsulated by the encapsulation layer 316. The encapsulation layer 316 may be distinct and separate from the first encapsulation layer 1216 in some implementations. In some implementations, the encapsulation layer 316 may include the first encapsulation layer 1216. In some implementations, the encapsulation layer 316 is the same as the first encapsulation layer 1216. Thus, in some implementations, the encapsulation layer 316 may both encapsulate the package on package (PoP) device 1800 and be located inside the package on package (PoP) device 1800. The above concept is illustrated in FIG. 18 by the dashed boundary (e.g., line) between the encapsulation layer 316 and the first encapsulation layer 1216.

The gap controller 1270 is located over the first die 1811 (e.g., back side of the first die 1811). In particular, the gap controller 1270 is located between the first die 1811 of the first package 1801, and the second package substrate 1220 of the second package 1202. In some implementations, the gap controller 1270 is configured to provide a minimum distance, a minimum space, and/or a minimum gap between the first die 1811 of the first package 1801, and the second package substrate 1220 of the second package 1202. In some implementations, the minimum distance, the minimum space, the minimum gap ensures that there is enough room for the first encapsulation layer 1216 to flow (e.g., during a fabrication process) between the first die 1811 of the first package 1801, and the second package substrate 1220 of the second package 1202, even when there is warpage, deformation, and/or deflection of the second package substrate 1220. Thus, in some implementations, at least one gap controller 1270 that is located over the first die 1811 (e.g., over a back side of the first die 1811) ensures that a sufficient amount of the first encapsulation layer 1216 is formed between the first die 1811 and the second package substrate 1220 (of the second package 1202).

Exemplary Package on Package (PoP) Device Comprising a Gap Controller

Figure 19:
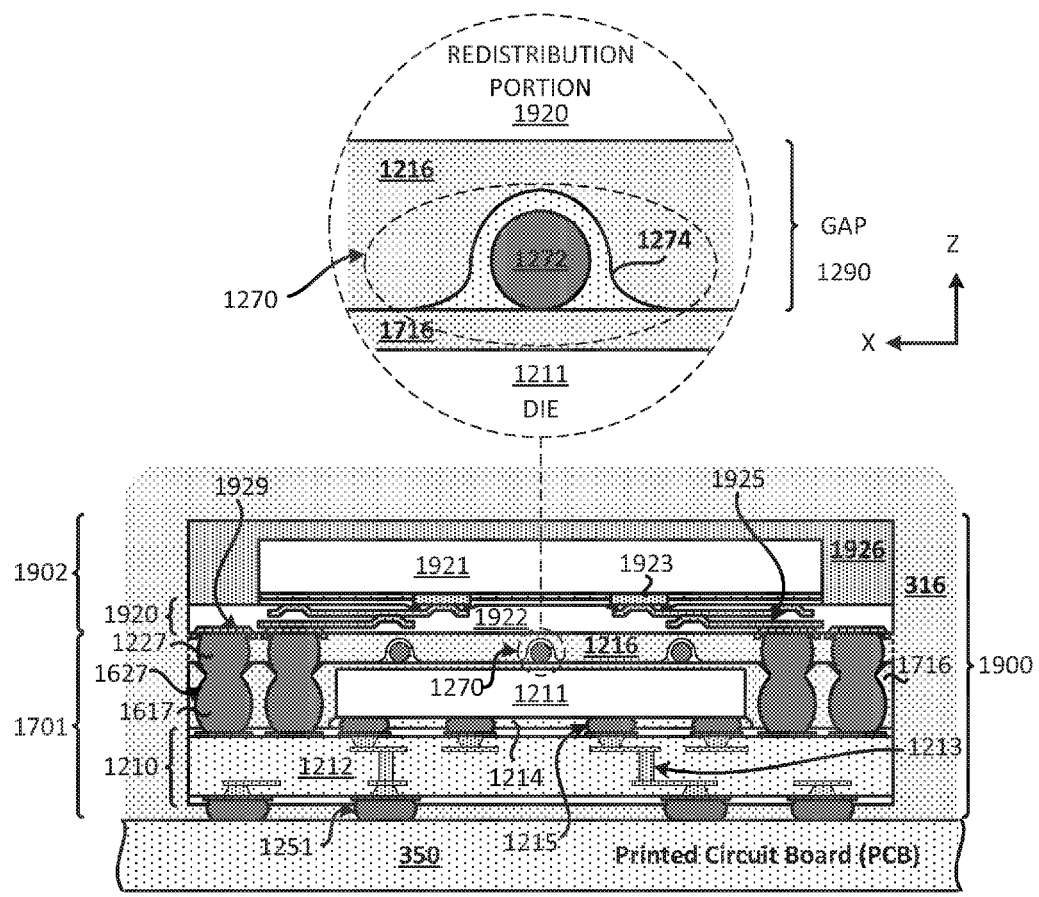
FIG. 19 illustrates a cross-sectional view of another package on package (PoP) device that includes a gap controller.

FIG. 19 illustrates another package on package (PoP) device 1900 that includes the first package 1701, a second package 1902, and the gap controller 1270. The second package 1902 is coupled to the first package 1701. The first package 1701 may be a first integrated circuit (IC) package. The package on package (PoP) device 1900 is coupled to a printed circuit board (PCB) 350 through the plurality of solder balls 1251. The package on package (PoP) device 1900 is similar to the package on package (PoP) device 1700 of FIG. 17, except that the second package 1902 has a different configuration. In particular, the second package 1902 includes a wafer level package (WLP). The package on package (PoP) device 1900 may be embedded in any of the integrated devices described in the present disclosure.

As will be further described below, in some implementations, the gap controller 1270 is configured to ensure that there is enough distance, space or gap between a die of the first package 1701, and a redistribution portion of the second package 1902, so that an encapsulation layer can be provided (e.g., formed) in the space or the gap between the die of the first package 1701, and the redistribution portion of the second package 1902. The gap controller 1270 may be optional.

The first package 1701 includes the first package substrate 1210, the first die 1211, the first underfill 1214, the plurality of first solder balls 1215, the first encapsulation layer 1216, the gap controller 1270, and the encapsulation layer 1716. Thus, the first package 1701 includes two encapsulation layers (e.g., 1216, 1716). In some implementations, the first package 1701 may also include the plurality of package interconnects 1627. The plurality of package interconnects 1627 may include the plurality of package interconnects 1617 and the plurality of package interconnects 1227.

The second package 1902 may include a fan out wafer level package (FOWLP). The second package 1902 includes a second redistribution portion 1920, a second die 1921, and a second encapsulation layer 1926. The second redistribution portion 1920 may be a fan out portion (e.g. for fanning or routing of signaling to and from devices with different I/O pitches).

The second redistribution portion 1920 includes at least one dielectric layer 1922, at least one redistribution layer 1925, and at least one underbump metallization (UBM) layer 1929. A redistribution layer (e.g. 1925) may redistribute signaling from I/O pads of a die to other parts of the package. The at least one redistribution layer 1925 is coupled to the at least one UBM layer 1929. The at least one UBM layer 1929 is coupled to the plurality of package interconnects 1227 (e.g., solder balls). In some implementations, the at least one UBM layer 1929 may be optional. In such instances, the plurality of package interconnects 1227 (e.g., solder balls) may be coupled to the at least one redistribution layer 1925.

The second die 1921 may be an integrated circuit (IC) that includes a plurality of transistors and/or other electronic components. The second die 1921 may be a logic die and/or a memory die. The second die 1921 may be a bare die. The second die 1921 may include the pad 1923. The second die 1921 is coupled to the second redistribution portion 1920. In particular, the pad 1923 of the second die 1921 is coupled to the at least one redistribution layer 1925.

The second encapsulation layer 1926 at least partially encapsulates the second die 1921. The second encapsulation layer 1926 is coupled to the second redistribution portion 1920. Different implementations may use different materials for the second encapsulation layer 1926. For example, the second encapsulation layer 1926 may include a mold and/or an epoxy fill.

As shown in FIG. 19, the gap controller 1270 is located over the encapsulation layer 1716. In particular, the gap controller 1270 is located between the first die 1211 of the first package 1701, and the second redistribution portion 1920 of the second package 1902. In some implementations, the gap controller 1270 is configured to provide a minimum distance, a minimum space, and/or a minimum gap between the encapsulation layer 1716 over the first die 1211 of the first package 1701, and the second redistribution portion 1920 of the second package 1902. In some implementations, the minimum distance, the minimum space, the minimum gap ensures that there is enough room for the first encapsulation layer 1216 to flow (e.g., during a fabrication process) between the encapsulation layer 1716 over first die 1211 of the first package 1701, and the second redistribution portion 1920 of the second package 1902, even when there is warpage, deformation, and/or deflection of the second redistribution portion 1920. Thus, in some implementations, at least one gap controller 1270 that is located over the encapsulation layer 1716 on the first die 1211 ensures that a sufficient amount of the first encapsulation layer 1216 is formed between the encapsulation layer 1716 over the first die 1211 and the second redistribution portion 1920 (of the second package 1902).

FIG. 19 illustrates that the package on package (PoP) device 1900 is at least partially encapsulated by the encapsulation layer 316. The encapsulation layer 316 may be distinct and separate from the first encapsulation layer 1216 in some implementations. In some implementations, the encapsulation layer 316 may include the first encapsulation layer 1216. In some implementations, the encapsulation layer 316 is the same as the first encapsulation layer 1216. Thus, in some implementations, the encapsulation layer 316 may both encapsulate the package on package (PoP) device 1900 and be located inside the package on package (PoP) device 1900. The above concept is illustrated in FIG. 19 by the dashed boundary (e.g., line) between the encapsulation layer 316 and the first encapsulation layer 1216.

FIG. 19 illustrates that the gap controller 1270 is not in direct physical contact with the first die 1211 nor the second package 1902 (e.g., second redistribution portion 1920 of the second package 1902). In some implementations, a surface of the encapsulation layer 1716 may be co-planar with a surface (e.g., top surface) of the first die 1211, for example, as described in FIG. 16. In such instances, the gap controller 1270 may be located over the first die 1211 and in physical contact with the first die 1211.

FIG. 19 also illustrates that the gap controller 1270 is configured to provide a gap 1290 (e.g., minimum gap) between the encapsulation layer 1716 over the first die 1211, and the second package 1902 (e.g., bottom surface of the second redistribution portion 1920 of the second package 1902). In some implementations, a gap between the first die 1211 and the second package 1902 (e.g., second redistribution portion 1920 of the second package 1902) may include the gap 1290 and a thickness of the encapsulation layer 1716 over the first die 1211.

Exemplary Package on Package (PoP) Device Comprising a Gap Controller

Figure 20:
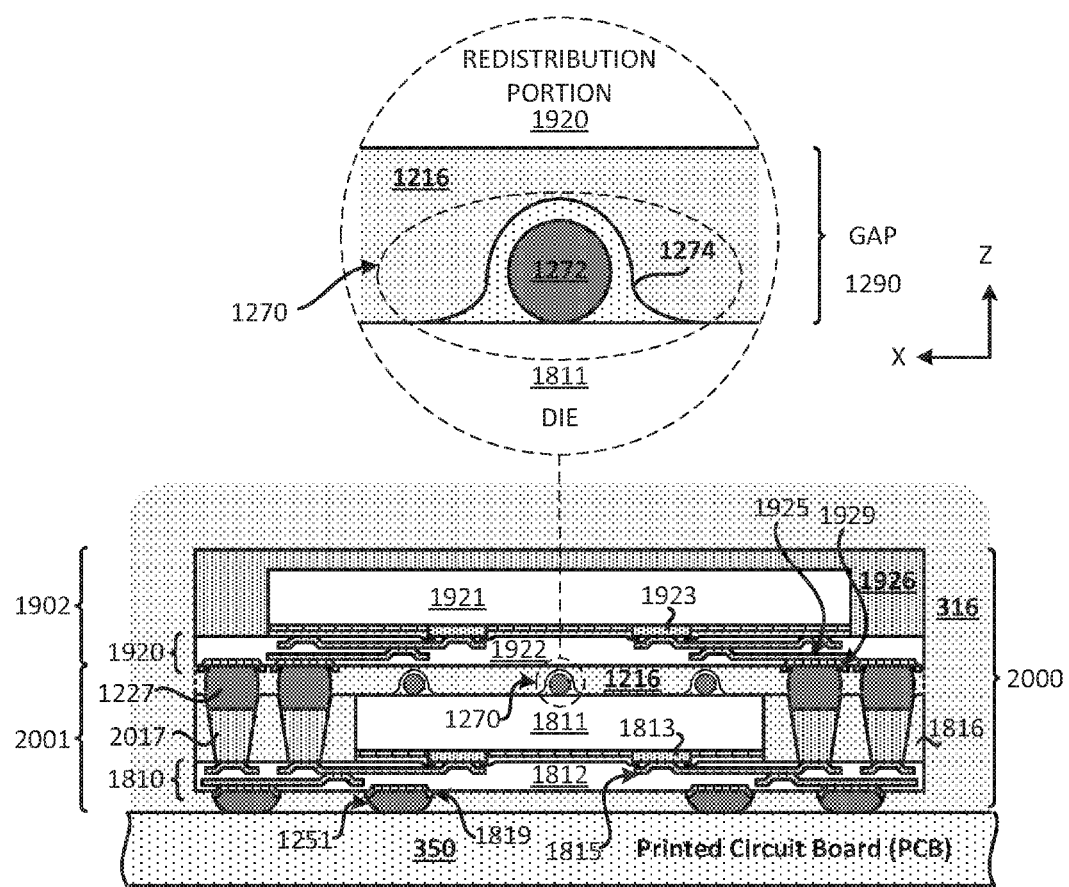
FIG. 20 illustrates a cross-sectional view of another package on package (PoP) device that includes a gap controller.

FIG. 20 illustrates another package on package (PoP) device 2000 that includes a first package 2001, the second package 1902, and the gap controller 1270. The second package 1902 is coupled to the first package 2001. The package on package (PoP) device 2000 is coupled to a printed circuit board (PCB) 350 through the plurality of solder balls 1251. The package on package (PoP) device 2000 is similar to the package on package (PoP) device 1900, except that the first package 2001 has a different configuration. In particular, the first package 2001 includes a wafer level package (WLP). Thus, the package on package (PoP) device 2000 of FIG. 20 includes two wafer level packages (WLPs). The package on package (PoP) device 2000 may be embedded in any of the integrated devices described in the present disclosure.

As described above and further described below, in some implementations, the gap controller 1270 is configured to ensure that there is enough distance, space or gap between a die of the first package 2001, and a redistribution portion of the second package 1902, so that an encapsulation layer can be provided (e.g., formed) in the space or the gap between the die of the first package 2001, and the redistribution portion of the second package 1902. The gap controller 1270 may be optional.

The first package 2001 may include a fan out wafer level package (FOWLP). The first package 2001 includes the first redistribution portion 1810, the first die 1811, the first encapsulation layer 1216, the encapsulation layer 1816, and a plurality of interconnects 2017 (e.g., vias). The first redistribution portion 1810 may be a fan out portion (e.g. for fanning or routing of signaling to and from devices with different I/O pitches). The first package 2001 may also include the plurality of package interconnects 1227.

The first redistribution portion 1810 includes at least one dielectric layer 1812, at least one redistribution layer 1815, and at least one underbump metallization (UBM) layer 1819. A redistribution layer (e.g. 1815) may redistribute signaling from I/O pads of a die to other parts of the package. The at least one redistribution layer 1815 is coupled to the at least one UBM layer 1819. The at least one UBM layer 1819 is coupled to the plurality of solder balls 1251. In some implementations, the at least one UBM layer 1819 may be optional. In such instances, the plurality of solder balls 1251 may be coupled to the at least one redistribution layer 1815.

The first die 1811 may be an integrated circuit (IC) that includes a plurality of transistors and/or other electronic components. The first die 1811 may be a logic die and/or a memory die. The first die 1811 may be a bare die. The first die 1811 may include the pad 1813. The first die 1811 is coupled to the first redistribution portion 1810. In particular, the pad 1813 of the first die 1811 is coupled to the at least one redistribution layer 1815.

The plurality of interconnects 2017 traverses the encapsulation layer 1816. The plurality of interconnects 2017 is coupled to the first redistribution portion 1810. In particular, the plurality of interconnects 2017 is coupled to the at least one redistribution layer 1815.

The encapsulation layer 1816 at least partially encapsulates the first die 1811 and the plurality of interconnects 2017. In some implementations, a surface of the encapsulation layer 1816 may be substantially co-planar with a surface (e.g., back side surface) of the first die 1811. The first encapsulation layer 1216 is formed over the first die 1811 and the encapsulation layer 1816. The encapsulation layer 1816 may be the same material or a different material as the first encapsulation layer 1216. The first encapsulation layer 1216 at least partially encapsulates the gap controller 1270 and the plurality of interconnects 1227.

The second package 1902 may include a fan out wafer level package (FOWLP). The second package 1902 includes the second redistribution portion 1920, the second die 1921, and the second encapsulation layer 1926. The second redistribution portion 1920 may be a fan out portion (e.g. for fanning or routing of signaling to and from devices with different I/O pitches).

The second package 1902 is coupled to the first package 2001 through the plurality of package interconnects 1227. The plurality of package interconnects 1227 may include a solder interconnect (e.g., solder ball). The plurality of package interconnects 1227 is coupled to the second redistribution portion 1920 and the plurality of interconnects 2017 (e.g., vias) of the first package 2001. In particular, the plurality of package interconnects 1227 is coupled to the UBM layer 1929 and the plurality of interconnects 2017 (e.g., vias) of the first package 2001. In some implementations, the plurality of package interconnects 1227 is coupled to the redistribution layer 1925 and the plurality of interconnects 2017 (e.g., vias) of the first package 2001.

The gap controller 1270 is located over the first die 1811 (e.g., over back side of the first die 1811). In particular, the gap controller 1270 is located between the first die 1811 of the first package 2001, and the second redistribution portion 1920 of the second package 1902. In some implementations, the gap controller 1270 is configured to provide a minimum distance, a minimum space, and/or a minimum gap between the first die 1811 of the first package 2001, and the second redistribution portion 1920 of the second package 1902. In some implementations, the minimum distance, the minimum space, the minimum gap ensures that there is enough room for the first encapsulation layer 1216 to flow (e.g., during a fabrication process) between the first die 1811 of the first package 2001, and the second redistribution portion 1920 of the second package 1902, even when there is warpage, deformation, and/or deflection of the second redistribution portion 1920. Thus, in some implementations, at least one gap controller 1270 that is located over the first die 1811 (e.g., over a back side of the first die 1811) ensures that a sufficient amount of the first encapsulation layer 1216 is formed between the first die 1811 and the second redistribution portion 1920 (of the second package 1902).

FIG. 20 illustrates that the package on package (PoP) device 2000 is at least partially encapsulated by the encapsulation layer 316. The encapsulation layer 316 may be distinct and separate from the first encapsulation layer 1216 in some implementations. In some implementations, the encapsulation layer 316 may include the first encapsulation layer 1216. In some implementations, the encapsulation layer 316 is the same as the first encapsulation layer 1216. Thus, in some implementations, the encapsulation layer 316 may both encapsulate the package on package (PoP) device 2000 and be located inside the package on package (PoP) device 2000. The above concept is illustrated in FIG. 20 by the dashed boundary (e.g., line) between the encapsulation layer 316 and the first encapsulation layer 1216.

Having described various examples of package on package (PoP) devices that include a gap controller, various processes and methods for fabricating a package on package (PoP) device that includes a gap controller will now be described.

Exemplary Sequence for Fabricating a Package Comprising a Gap Controller

Figure 21A:
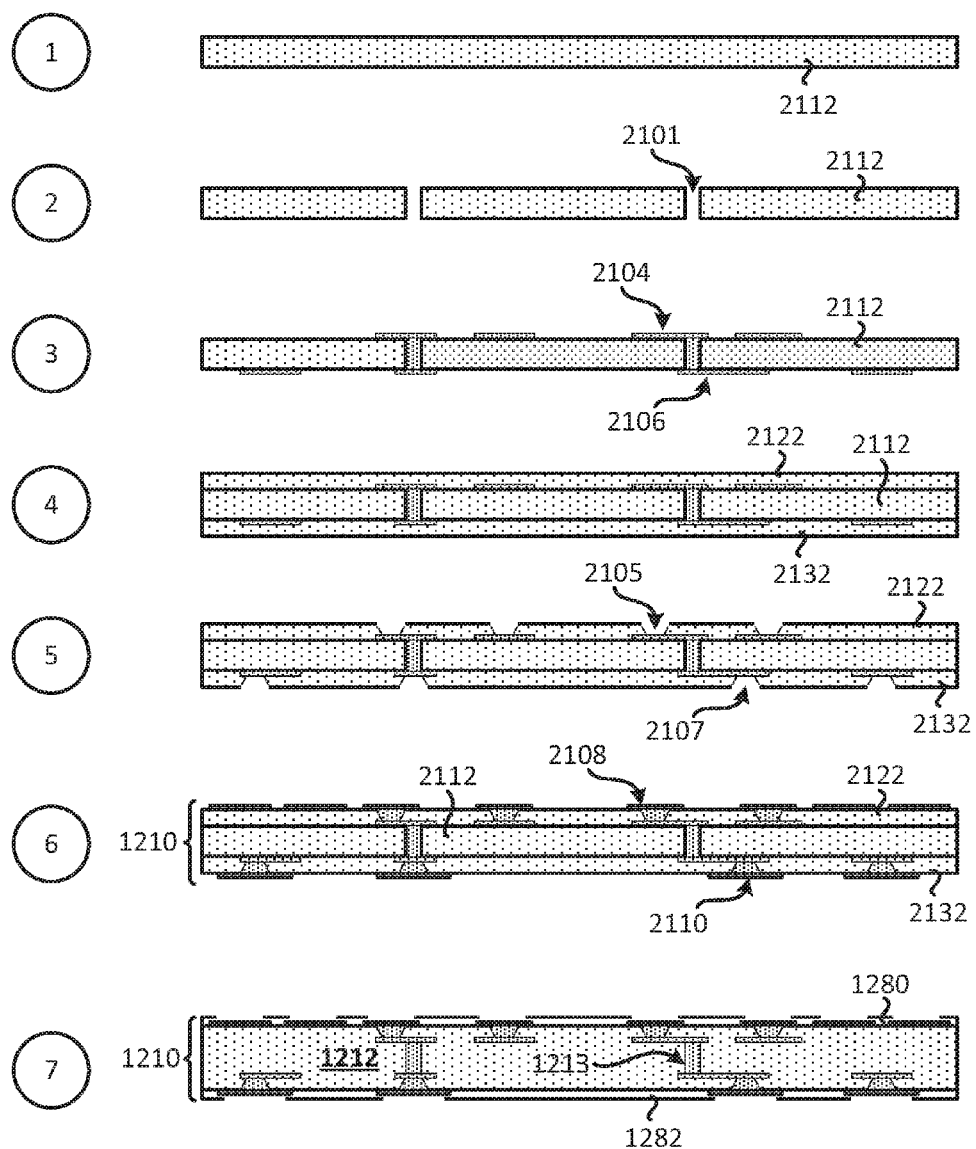
FIG. 21 (which comprises FIGS. 21A-21C) illustrates an example of a sequence for fabricating a package that includes a gap controller.
Figure 21B:
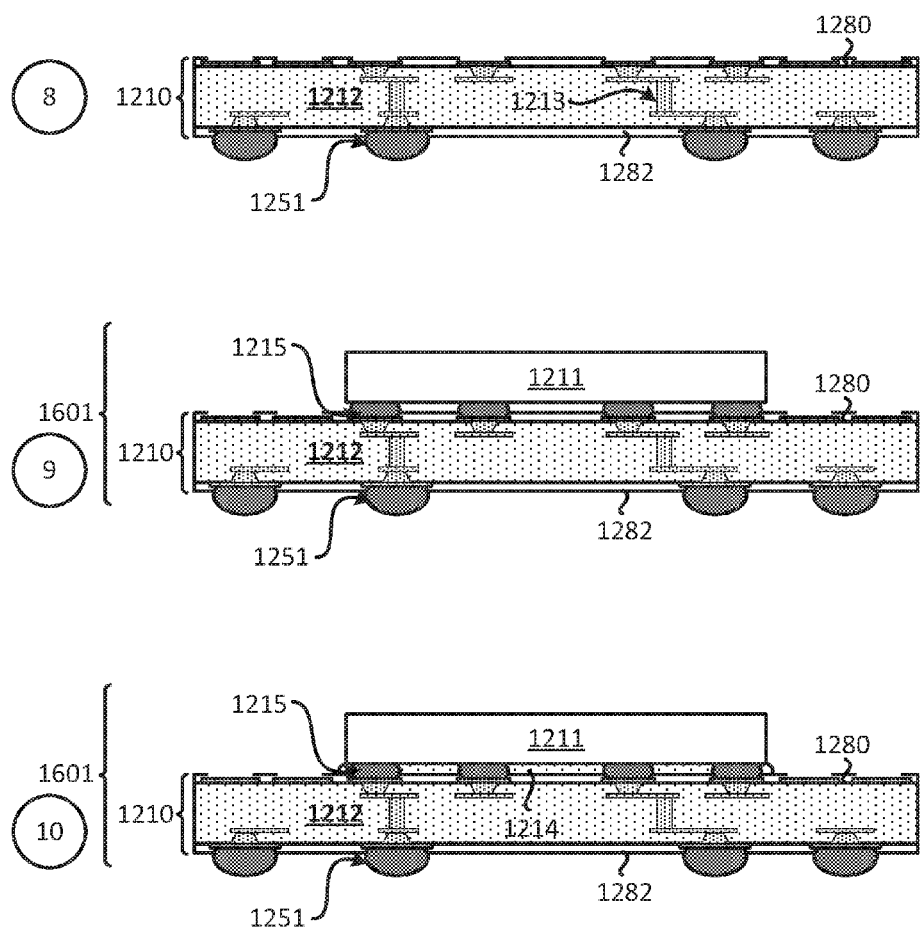
Figure 21C:
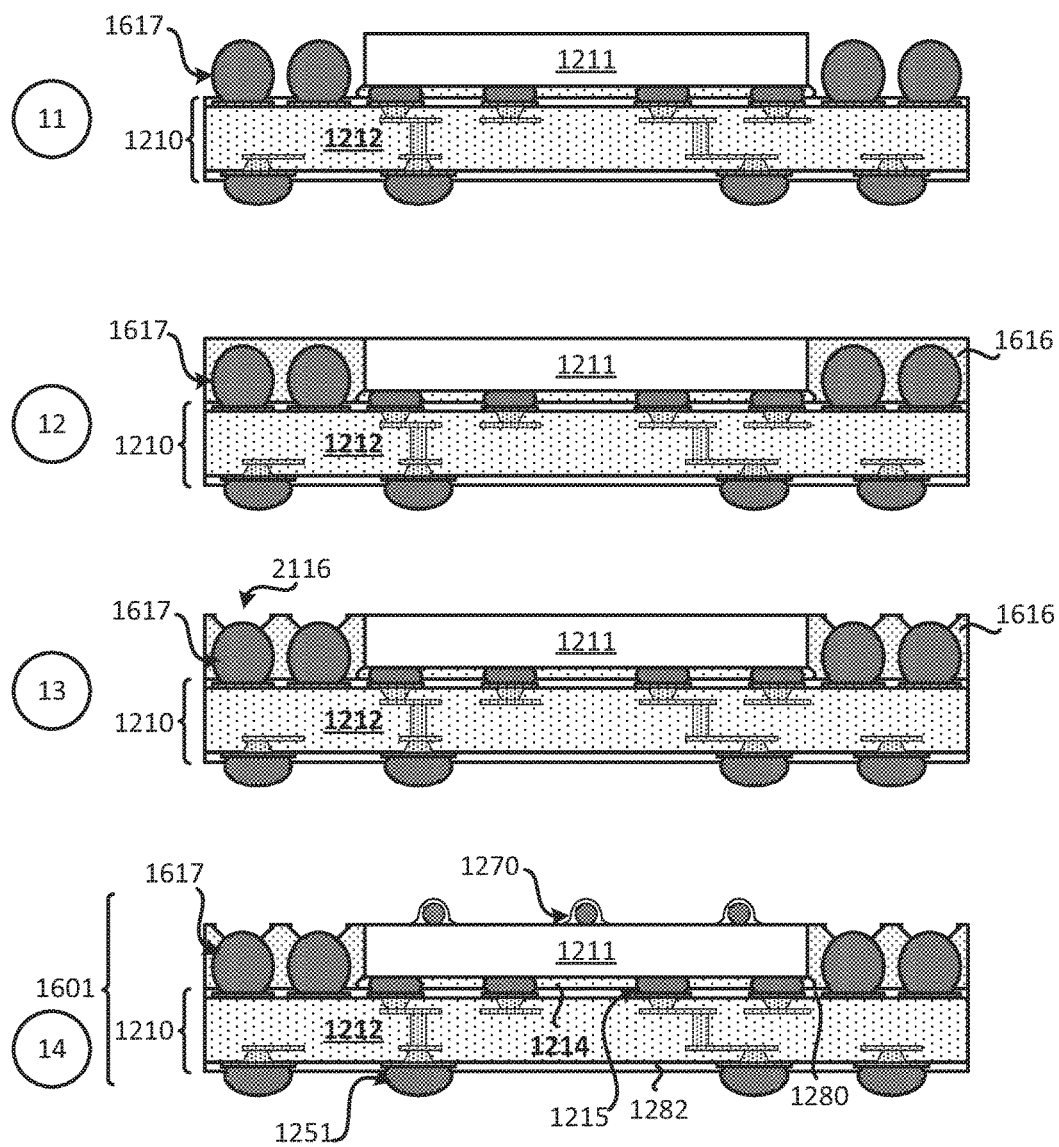

In some implementations, providing/fabricating a package that includes a gap controller includes several processes. FIG. 21 (which includes FIGS. 21A-21C) illustrates an exemplary sequence for providing/fabricating a package that includes a gap controller. In some implementations, the sequence of FIGS. 21A-21C may be used to fabricate the package (e.g., integrated circuit (IC) package) that includes a gap controller of FIGS. 12 and 16-19 and/or other packages described in the present disclosure. FIGS. 21A-21C will be described in the context of providing/fabricating a package of FIG. 16. In particular, FIGS. 21A-21C will be described in the context of fabricating the first package 1601 of FIG. 16.

It should be noted that the sequence of FIGS. 21A-21C may combine one or more stages in order to simplify and/or clarify the sequence for providing a package. In some implementations, the order of the processes may be changed or modified.

Stage 1, as shown in FIG. 21A, illustrates a first dielectric layer 2112 provided. The first dielectric layer 2112 may be a core layer. The first dielectric layer 2112 may be formed or provided by a supplier.

Stage 2 illustrates at least one cavity 2101 formed in the first dielectric layer 2112. Different implementations may form the cavity 2101 in the first dielectric layer 2112 differently. A laser process and/or a photo-lithography process may be used to form the cavity 2101.

Stage 3 illustrates a first metal layer 2104 and a second metal layer 2106 formed on and/or in the first dielectric layer 2112. The first metal layer 2104 and the second metal layer 2106 may represent the plurality of first interconnects 1213, as described above in at least FIG. 16.

Stage 4 illustrates a second dielectric layer 2122 and a third dielectric layer 2132 formed on the first dielectric layer 2112.

Stage 5 illustrates at least one cavity 2105 formed in the second dielectric layer 2122, and at least one cavity 2107 formed in the third dielectric layer 2132. Different implementations may form the cavity 2105 in the second dielectric layer 2122 and the cavity 2107 in the third dielectric layer 2132 differently. A laser process and/or a photo-lithography process may be used to form the cavity 2105 and/or the cavity 2107.

Stage 6 illustrates a third metal layer 2108 formed on and/or in the second dielectric layer 2122, a fourth metal layer 2110 formed on and/or in the third dielectric layer 2132. The third metal layer 2108 and the fourth metal layer 2110 may represent the plurality of first interconnects 1213, as described above in at least FIG. 16. Stage 6 may represent a package substrate (e.g., first package substrate 1210) that includes at least one dielectric layer and a plurality of first interconnects.

Stage 7 illustrates a first solder resist layer 1280 formed over the dielectric layer 1212, and a second solder resist layer 1282 formed over the dielectric layer 1212. The dielectric layer 1212 may collectively represent the first dielectric layer 2112, the second dielectric layer 2122, and the third dielectric layer 2132. Stage 7 may represent a package substrate (e.g., first package substrate 1210) that includes the dielectric layer 1212, the plurality of first interconnects 1213, the first solder resist layer 1280, and the second solder resist layer 1282.

Stage 8, as shown in FIG. 21B, illustrates the plurality of solder balls 1251 coupled to the first package substrate 1210. In particular, the plurality of solder balls 1252 is coupled to the plurality of first interconnects 1213.

Stage 9 illustrates the first die 1211 coupled to the first package substrate 1210, through the plurality of first solder balls 1215. Different implementations may couple the first die 1211 to the first package substrate 1210 differently (e.g., by using interconnect pillars). In some implementations, a reflow process (e.g., chip attach reflow process) may be used to couple the first die 1211 to the first package substrate 1210. In some implementations, a reflux process may be used after the reflow process.

Stage 10 illustrates a first underfill 1214 provided between the first die 1211 and the first package substrate 1210. The first underfill 1214 may at least partially surround the plurality of first solder balls 1215. In some implementations, providing the first underfill 1214 includes an underfill dispense process.

Stage 11, as shown in FIG. 21C, illustrates a plurality of package interconnects 1617 provided (e.g., formed) over the first package substrate 1210. The plurality of package interconnects 1617 may include a solder interconnect.

Stage 12 illustrates an encapsulation layer 1616 at least partially formed over the first die 1211, the first package substrate 1210, and the plurality of package interconnects 1617. In some implementations, the encapsulation layer 1616 at least partially encapsulates the first die 1211 and the plurality of package interconnects 1617. In some implementations, the first die 1211 is completely encapsulated by the encapsulation layer 1616 and the encapsulation layer 1616 is grinded down such that a top surface of the encapsulation layer 1616 is substantially co-planar with a surface (e.g., back side surface) of the first die 1211.

Stage 13 illustrates at least one cavity 2116 formed in the encapsulation layer 1616. The cavity 2116 may be formed to at least partially expose the plurality of package interconnects 1617. A laser process and/or a photo-lithography process may be used to form the cavity 2116.

Stage 14 illustrates at least one gap controller 1270 coupled to the first die 1211 (e.g., to the back side surface of the first die 1211). Stage 14 illustrates in some implementations, a first package 1601 that includes a first package substrate 1210, a first die 1211, a plurality of package interconnects 1617, an encapsulation layer 1616, and at least one gap controller 1270. In some implementations, the at least one gap controller 1270 is deposited on the first die 1211.

In some implementations, several first packages are concurrently fabricated on wafer, and a singulation process is performed to cut a wafer into individual packages.

Figure 22:
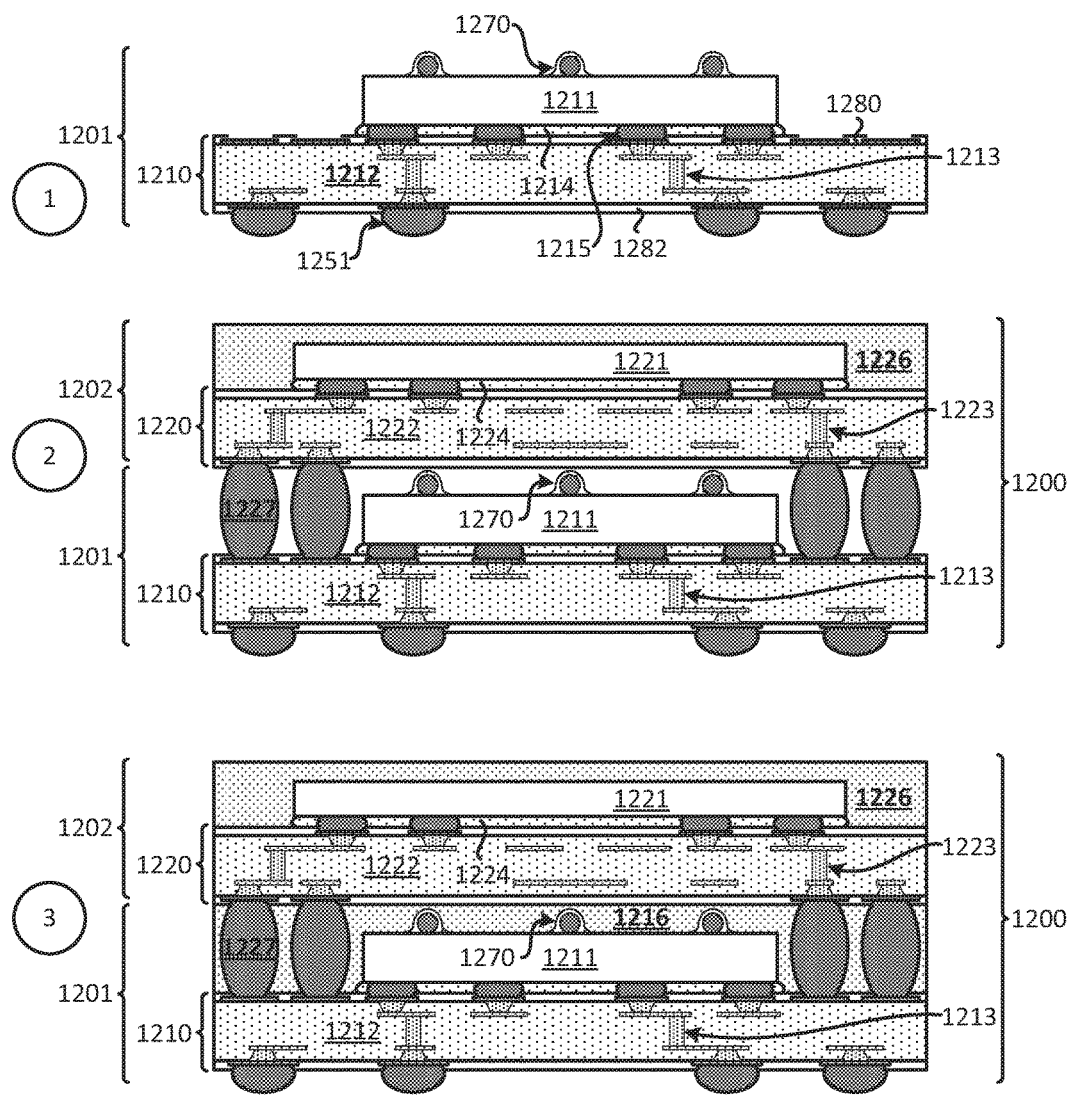
FIG. 22 illustrates an example of a sequence for fabricating a package on package (PoP) device that includes a gap controller.

Exemplary Sequence for Fabricating a Package on Package (PoP) Device Comprising a Gap Controller In some implementations, providing/fabricating a package on package (PoP) device that includes a gap controller includes several processes. FIG. 22 illustrates an exemplary sequence for providing/fabricating a package on package (PoP) device that includes a gap controller. In some implementations, the sequence of FIG. 22 may be used to fabricate the package on package (PoP) device that includes a gap controller of FIGS. 12 and 16-17 and/or other package on package (PoP) devices described in the present disclosure. FIG. 22 will be described in the context of providing/fabricating the package on package (PoP) device of FIG. 12.

It should be noted that the sequence of FIG. 22 may combine one or more stages in order to simplify and/or clarify the sequence for providing a package on package (PoP) device. In some implementations, the order of the processes may be changed or modified.

Stage 1, as shown in FIG. 22, illustrates a first package 1201 provided. The first package 1201 includes the first package substrate 1210, the first die 1211, the first underfill 1214, and the gap controller 1270. FIGS. 21A-21C illustrates an example of sequence for fabricating the first package 1201.

Stage 2 illustrates a second package 1202 coupled to the first package 1201 through the plurality of package interconnects 1227. The second package 1202 includes the second package substrate 1220, the second die 1221, the second underfill 1224, and the second encapsulation layer 1226. The second package 1202 may also include the plurality of package interconnects 1227. The plurality of package interconnects 1227 includes a solder interconnect (e.g., solder ball).

Stage 3 illustrates a first encapsulation layer 1216 provided (e.g., formed) between the first package 1201 and the second package 1202. Stage 3 may illustrate a package on package (PoP) device 1200 that includes the first package 1201 and the second package 1202. The first package 1201 includes the first die 1211, the gap controller 1270, and the first encapsulation layer 1216. The second package 1202 may include the second package substrate 1220.

As shown at stage 3, the first encapsulation layer 1216 is formed between the back side surface of the first die 1211 of the first package 1201, and the bottom surface of the second package substrate 1220 of the second package 1202.

Exemplary Sequence for Fabricating a Package Comprising a Gap Controller

Figure 23A:
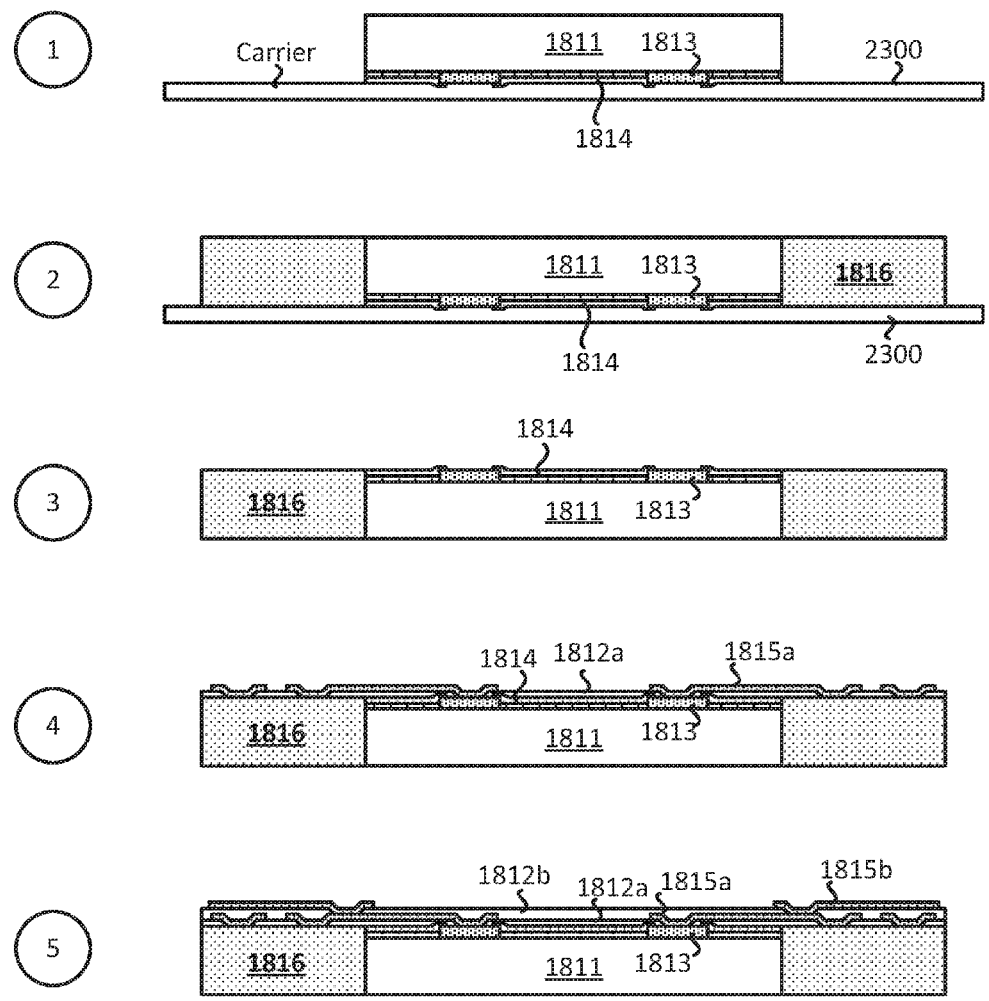
FIG. 23 (which comprises FIGS. 23A-23B) illustrates an example of a sequence for fabricating a package that includes a gap controller.
Figure 23B:
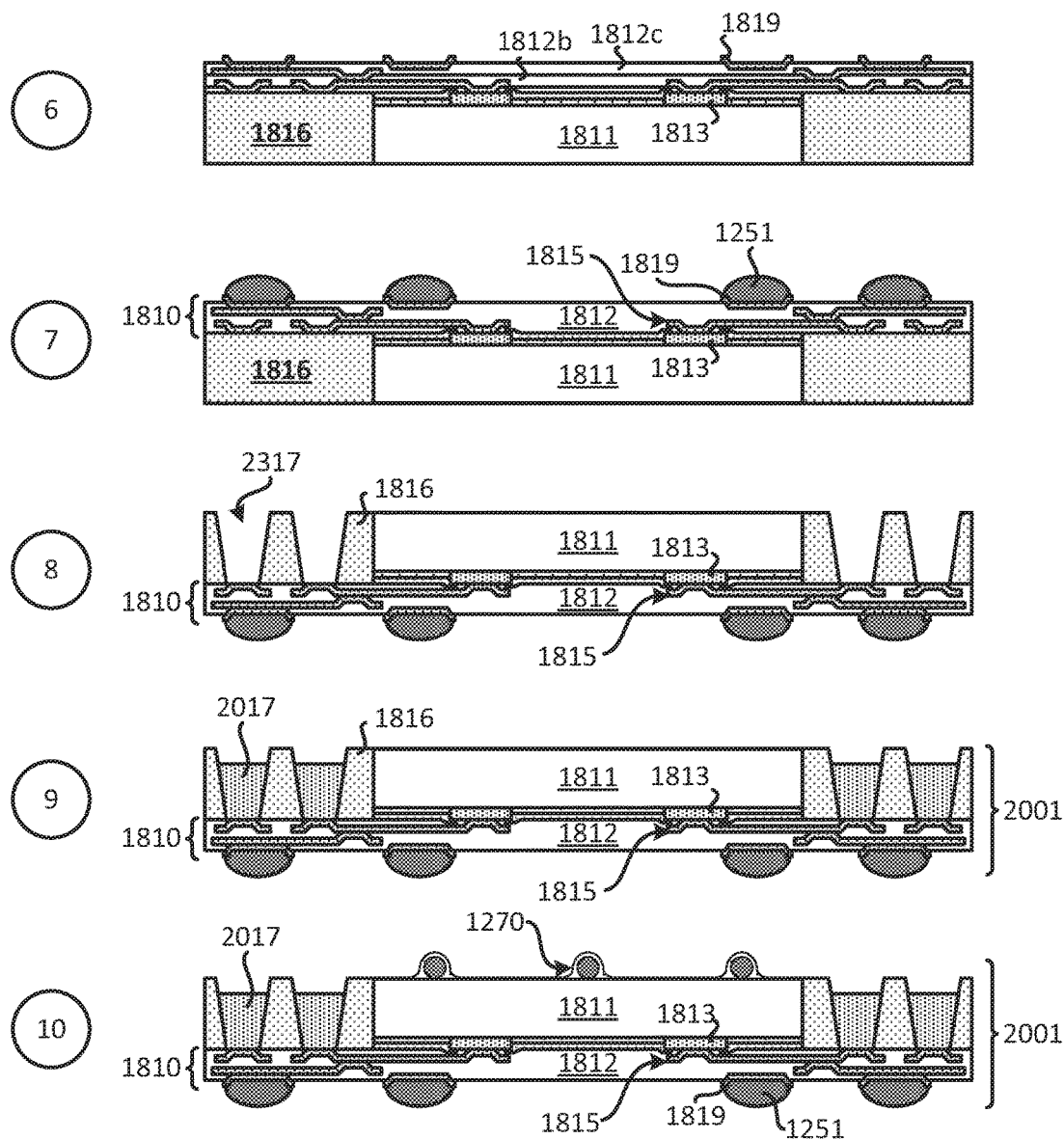

In some implementations, providing/fabricating a package that includes a gap controller includes several processes. FIG. 23 (which includes FIGS. 23A-23B) illustrates an exemplary sequence for providing/fabricating a package that includes a gap controller. In some implementations, the sequence of FIGS. 23A-23B may be used to fabricate a package (e.g., integrated circuit (IC) package) that includes a gap controller of FIGS. 18-20 and/or other packages described in the present disclosure. FIGS. 23A-23B will be described in the context of providing/fabricating the package of FIG. 20. In particular, FIGS. 23A-23B will be described in the context of fabricating the first package 2001 of FIG. 20. FIGS. 23A-23B may be used to fabricate a fan out wafer level package (FOWLP).

It should be noted that the sequence of FIGS. 23A-23B may combine one or more stages in order to simplify and/or clarify the sequence for providing a package. In some implementations, the order of the processes may be changed or modified.

Stage 1, as shown in FIG. 23A, illustrates a first die 1811 coupled to a carrier 2300. The first die 1811 includes a pad 1813 and at least one passivation layer 1814. The carrier 2300 may be an adhesive tape layer.

Stage 2 illustrates an encapsulation layer 1816 formed over the first die 1811. The encapsulation layer 1816 may at least partially encapsulate the first die 1811. The encapsulation layer 1816 is formed such that a surface of the encapsulation layer 1816 is substantially co-planar with a back side surface of the first die 1811. In some implementations, the encapsulation layer 1816 may be formed differently around the first die 1811.

Stage 3 illustrates the first die 1811 and the encapsulation layer 1816 decoupled (e.g., detached) from the carrier 2300.

Stage 4 illustrates a first dielectric layer 1812a and a first redistribution layer 1815a formed over the first die 1811 and the encapsulation layer 1816. The first dielectric layer 1812a is formed over the passivation layer 1814 of the first die 1811. The first redistribution layer 1815a is formed such that the first redistribution layer 1815a is coupled to the pad 1813 of the first die 1811.

Stage 5 illustrates a second dielectric layer 1812b formed over the first dielectric layer 1812a and the first redistribution layer 1815a. Stage 5 also illustrates a state after a second redistribution layer 1815b is formed over and coupled to the first redistribution layer 1815a. The first redistribution layer 1815a and the second redistribution layer 1815b may represent the redistribution layer 1815.

Stage 6, as shown in FIG. 23B, illustrates a third dielectric layer 1812c formed over the second dielectric layer 1812b and the second redistribution layer 1815b. Stage 6 also illustrates a state after a UBM layer 1819 is formed over and coupled to the second redistribution layer 1815b. The first dielectric layer 1812a, the second dielectric layer 1812b and the third dielectric layer 1812c may represent the dielectric layer 1812.

Stage 7 illustrates a plurality of solder balls 1251 coupled to the UBM layer 1819. In some implementations, the UBM layer 1819 may be optional. In such instances, the plurality of solder balls 1851 may be coupled to the redistribution layer 1815.

Stage 8 illustrates at least one cavity 2317 formed in the encapsulation layer 1816. Different implementations may form the cavity 2317 in the encapsulation layer 1816 differently. A laser process and/or a photo-lithography process may be used to form the cavity 2317. Stage 8 illustrates a first redistribution portion 1810 that includes the dielectric layer 1812, the redistribution layer 1815 and the UBM layer 1819.

Stage 9 illustrates a plurality of interconnects 2017 formed in the cavity 2317 of the encapsulation layer 1816. The plurality of interconnects 2017 may include a via. A plating process may be used to form the plurality of interconnects 2017.

Stage 10 illustrates at least one gap controller 1270 coupled to the first die 1811 (e.g., to the back side surface of the first die 1811). Stage 10 illustrates in some implementations, a first package 2001 that includes the first redistribution portion 1810, the first die 1811, the encapsulation layer 1816, the plurality of interconnects 2017, and at least one gap controller 1270.

In some implementations, several first packages are concurrently fabricated on wafer, and a singulation process is performed to cut a wafer into individual packages.

Figure 24:
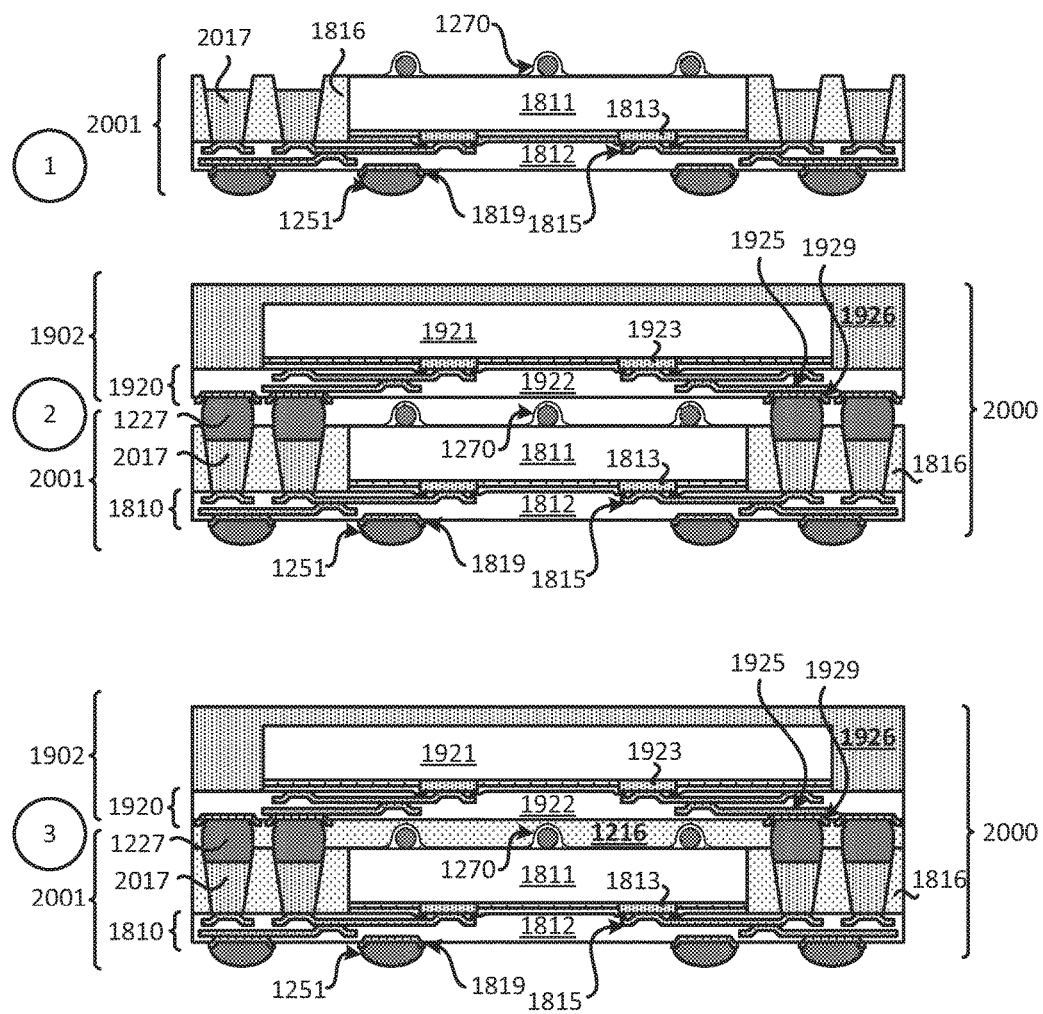
FIG. 24 illustrates an example of a sequence for fabricating a package on package (PoP) device that includes a gap controller.

Exemplary Sequence for Fabricating a Package on Package (PoP) Device Comprising a Gap Controller In some implementations, providing/fabricating a package on package (PoP) device that includes a gap controller includes several processes. FIG. 24 illustrates an exemplary sequence for providing/fabricating a package on package (PoP) device that includes a gap controller. In some implementations, the sequence of FIG. 24 may be used to fabricate the package on package (PoP) device that includes a gap controller of FIG. 20 and/or other package on package (PoP) devices described in the present disclosure. FIG. 24 will be described in the context of providing/fabricating the package on package (PoP) device of FIG. 20.

It should be noted that the sequence of FIG. 24 may combine one or more stages in order to simplify and/or clarify the sequence for providing a package on package (PoP) device. In some implementations, the order of the processes may be changed or modified.

Stage 1, as shown in FIG. 24, illustrates a first package 2001 provided. The first package 2001 may be a fan out wafer level package (FOWLP). The first package 2001 includes the first redistribution portion 1810, at least one redistribution layer 1815, at least one UBM layer 1819, the first die 1811, the pad 1813, and the gap controller 1270. FIGS. 23A-23B illustrate an example of a sequence for fabricating the first package 2001.

Stage 2 illustrates a second package 1902 coupled to the first package 2001 through the plurality of package interconnects 227. The second package 1902 includes the second redistribution portion 1920, at least one redistribution layer 1925, at least one UBM layer 1929, the second die 1921, and the pad 1923. The second package 1902 may also include the plurality of package interconnects 227. The plurality of package interconnects 1227 includes a solder interconnect (e.g., solder ball).

Stage 3 illustrates a first encapsulation layer 1216 provided (e.g., formed) between the first package 2001 and the second package 1902. Stage 3 may illustrate a package on package (PoP) device 2000 that includes the first package 2001 and the second package 1902. The first package 2001 includes the first die 1811, the gap controller 1270, and the first encapsulation layer 1216. The second package 1902 may include the second redistribution portion 1920.

As shown at stage 3, the first encapsulation layer 1216 formed between the back side surface of the first die 1811 of the first package 2001, and the bottom surface of the second redistribution portion 1920 of the second package 1902.

Figure 25:
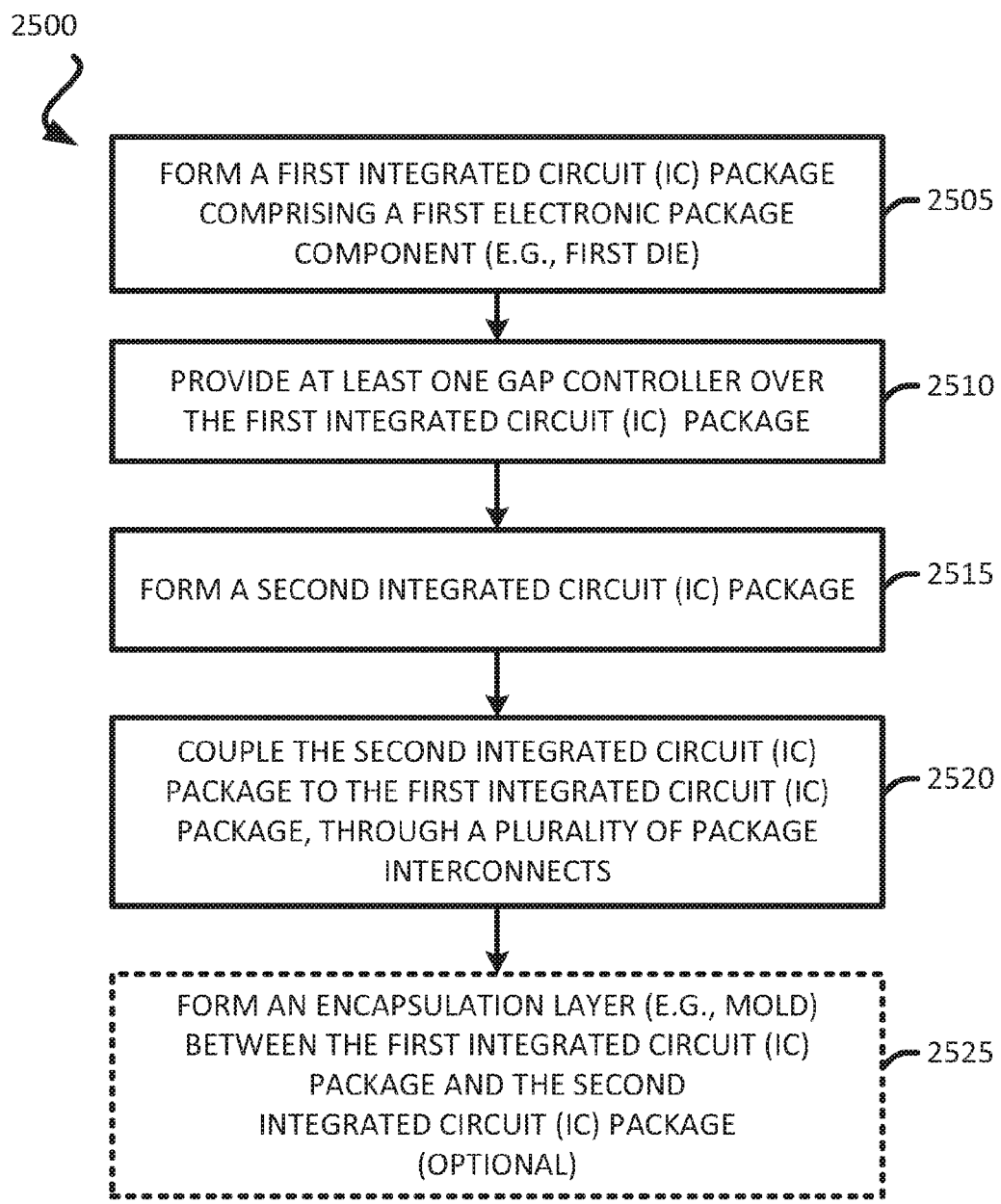
FIG. 25 illustrates a flow diagram of an exemplary method for fabricating a package on package (PoP) device that includes a gap controller.

Exemplary Method for Fabricating a Package on Package (PoP) Device Comprising a Gap Controller In some implementations, providing/fabricating a package on package (PoP) that includes a gap controller includes several processes. FIG. 25 illustrates an exemplary flow diagram of a method for providing/fabricating package on package (PoP) that includes a gap controller. In some implementations, the method of FIG. 25 may be used to provide/fabricate the package on package (PoP) that includes a gap controller of FIGS. 12, 16-20 and/or other package on package (PoP) devices described in the present disclosure. FIG. 25 will be described in the context of providing/fabricating the device package of FIG. 12.

It should be noted that the flow diagram of FIG. 25 may combine one or more processes in order to simplify and/or clarify the method for providing a package on package (PoP) device. In some implementations, the order of the processes may be changed or modified.

At stage 2505, a first integrated circuit (IC) package that includes a first electronic package component (e.g., first die) is formed. Examples of forming a first integrated circuit (IC) package are illustrated and described in FIGS. 21A-21C and 23A-23B. In some implementations, the first integrated circuit (IC) package may include a fan out wafer level package (FOWLP). The first integrated circuit (IC) package may include a package substrate or a redistribution portion. The first integrated circuit (IC) package may include an encapsulation layer. Examples of a first package (e.g., first integrated circuit (IC) package) include the first package 1201, the first package 1601, the first package 1701, the first package 1801, and the first package 2001.

At stage 2510, at least one gap controller is provided over the first integrated circuit (IC) package. The gap controller may be provided and coupled to the first die (e.g., on or about a center of the back side surface of the first die 1211). Examples of a gap controller include the gap controller 1270, the gap controller 1370, the gap controller 1470, and the gap controller 1570.

At stage 2515, a second integrated circuit (IC) package that includes a second die is formed. Examples of forming a second integrated circuit (IC) package are illustrated and described in FIGS. 21A-21C and 23A-23B. In some implementations, the second integrated circuit (IC) package may include a fan out wafer level package (FOWLP). The second integrated circuit (IC) package may include a package substrate or a redistribution portion. The second integrated circuit (IC) package may include an encapsulation layer. Examples of a second package (e.g., second integrated circuit (IC) package) include the second package 1202 and the second package 1902.

At stage 2520, the second integrated circuit (IC) package is coupled to the first integrated circuit (IC) package through a plurality of package interconnects (e.g., plurality of package interconnects 1227).

At stage 2525, a first encapsulation layer is optionally formed between the first integrated circuit (IC) package and the second integrated circuit (IC) package. In particular, the first encapsulation layer (e.g., first encapsulation layer 1216) is formed between the first die of a first package and the second package (e.g., second package substrate of the second package, second redistribution portion of the second package).

Exemplary Electronic Devices

Figure 26:
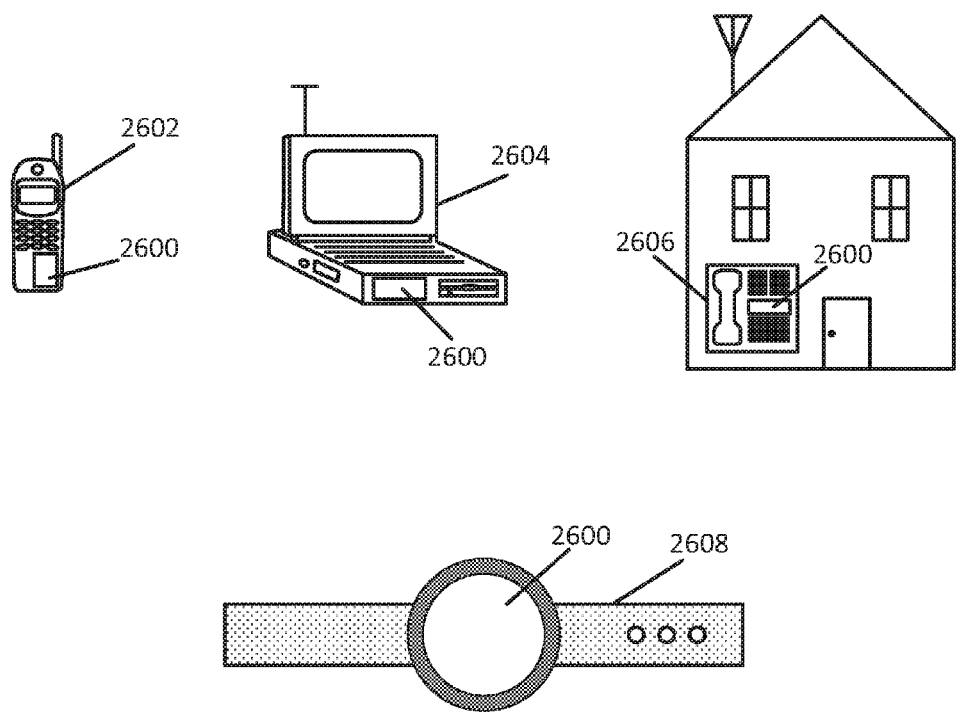
FIG. 26 illustrates various electronic devices that may include the various integrated devices, integrated device packages, semiconductor devices, dies, integrated circuits, and/or packages described herein.

FIG. 26 illustrates various electronic devices that may be integrated with any of the aforementioned integrated device, semiconductor device, integrated circuit, die, interposer, package or package-on-package (PoP). For example, a mobile phone device 2602, a laptop computer device 2604, a fixed location terminal device 2606, a wearable device 2608 may include an integrated device 2600 as described herein. The integrated device 2600 may be, for example, any of the integrated circuits, dies, integrated devices, integrated device packages, integrated circuit devices, device packages, integrated circuit (IC) packages, package-on-package devices described herein. The devices 2602, 2604, 2606, 2608 illustrated in FIG. 26 are merely exemplary. Other electronic devices may also feature the integrated device 2600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4, 5, 6, 7, 8, 9, 10, 11, 12, 13, 14, 15, 16, 17, 18, 19, 20, 21A-21C, 22, 23A-23B, 24, 25 and/or 26 may be rearranged and/or combined into a single component, process, feature or function or embodied in several components, processes, or functions. Additional elements, components, processes, and/or functions may also be added without departing from the disclosure. It should also be noted that FIGS. 2, 3, 4, 5, 6, 7, 8, 9, 10, 11, 12, 13, 14, 15, 16, 17, 18, 19, 20, 21A-21C, 22, 23A-23B, 24, 25 and/or 26 and its corresponding description in the present disclosure is not limited to dies and/or ICs. In some implementations, FIGS. 2, 3, 4, 5, 6, 7, 8, 9, 10, 11, 12, 13, 14, 15, 16, 17, 18, 19, 20, 21A-21C, 22, 23A-23B, 24, 25 and/or 26 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a printed circuit board (PCB);
   a package on package (PoP) device coupled to the printed circuit board (PCB), wherein the package on package (PoP) device comprises:
      a first package comprising a first electronic package component; and
      a second package coupled to the first package such that there is a spacing between the first electronic package component and the second package, wherein the spacing is about 10 to 100 microns (μm);
      a gap controller configured to provide the spacing between the first electronic package component and the second package, the gap controller includes a spacer and an adhesive layer;
   a first encapsulation layer formed between the first package and the second package such that the first encapsulation layer is coupled to the first package and the second package, the first encapsulation layer located over the gap controller and configured to at least partially encapsulate the gap controller including the spacer and the adhesive layer; and
   a second encapsulation layer that at least partially encapsulates the package on package (PoP) device,
   wherein the integrated device is configured to provide cellular functionality, wireless fidelity (WiFi) functionality and Bluetooth functionality.

2. The integrated device of claim 1, wherein the second encapsulation layer includes the first encapsulation layer.

3. The integrated device of claim 1, wherein the first encapsulation layer is separate from the second encapsulation layer.

4. The integrated device of claim 1, further comprising at least one electronic package component coupled to the printed circuit board (PCB), wherein the at least one electronic package component is external to the package on package (PoP) device.

5. The integrated device of claim 4, wherein the package on package (PoP) device and the at least one electronic package component are configured to provide cellular functionality, wireless fidelity (WiFi) functionality and Bluetooth functionality.

6. The integrated device of claim 4, wherein the integrated device is configured to provide global positioning system (GPS) functionality, wireless fidelity (WiFi) functionality, Bluetooth functionality, and at least one radio frequency front end (RFFE) functionality.

7. The integrated device of claim 6, wherein at least one radio frequency front end (RFFE) functionality includes Global System for Mobile Communications (GSM), Wideband Code Division Multiple Access (WCDMA), Frequency Division Duplex Long-Term Evolution (FDD-LTE), and/or Time Division Duplex Long-Term Evolution (TDD-LTE).

8. The integrated device of claim 4, further comprising an internal shield configured to at least partially surround the at least one electronic package component, wherein the internal shield is configured to isolate the at least one electronic package component from the package on package (PoP) device.

9. The integrated device of claim 8, further comprising an external shield formed over the second encapsulation layer, wherein the external shield is coupled to the internal shield.

10. The integrated device of claim 1, wherein the gap controller is located between the first package and the second package and is configured to provide a minimum gap between the first package and the second package, wherein the minimum gap is about 10 microns (μm).

11. The integrated device of claim 10, wherein the second package includes a second package substrate, and the gap controller is located between the first electronic package component and the second package substrate.

12. The integrated device of claim 11, wherein the first encapsulation layer is formed between the first electronic package component and the second package substrate.

13. The integrated device of claim 10, wherein the second package includes a second redistribution portion, and the gap controller is located between the first electronic package component and the second redistribution portion.

14. The integrated device of claim 13, wherein the first encapsulation layer is formed between the first electronic package component and the second redistribution portion.

15. The integrated device of claim 10, wherein the gap controller is coupled to the first package, but free of coupling with the second package.

16. The integrated device of claim 1, wherein the first encapsulation layer fills at least a majority of a space between the first electronic package component and the second package.

17. The integrated device of claim 1, wherein the integrated device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

18. The integrated device of claim 1, wherein the first encapsulation layer is formed between the first electronic package component and the second package such that the first encapsulation layer is coupled to the first electronic package component and the second package.

19. The integrated device of claim 1, wherein the first encapsulation layer is formed between the first package and the second package such that the first encapsulation layer encapsulates a side portion and a top portion of the first electronic package component.

20. The integrated device of claim 1, wherein the first package is configured to electrically couple to the second package through a plurality of package interconnects, the plurality of package interconnects being encapsulated by the first encapsulation layer.

21. The integrated device of claim 1, wherein the integrated device has dimensions between about 26 mm (W)×26 mm (L)×1.8 mm (H), and about 52 mm (W)×52 mm (L)×2 mm (H).

22. The integrated device of claim 1, wherein a top of the spacer is directly coupled to a top of the adhesive, and the top of the adhesive is directly coupled to the first encapsulation layer.

23. The integrated device of claim 1, wherein the gap controller is in direct contact with the first electronic package component, but not in direct contact with the second package.

24. An apparatus comprising:
a printed circuit board (PCB);
a package on package (PoP) device coupled to the printed circuit board (PCB), wherein the package on package (PoP) device comprises:
 a first package comprising a first electronic package component; and
 a second package coupled to the first package;
 a gap controller configured to provide a spacing between the first package and the second package, the gap controller includes a spacer and an adhesive layer;
a first encapsulation layer formed between the first package and the second package such that the first encapsulation layer is coupled to the first package and the second package, the first encapsulation layer located over the gap controller and configured to at least partially encapsulate the gap controller including the spacer and the adhesive layer; and
a second encapsulation layer that at least partially encapsulates the package on package (PoP) device,
wherein the apparatus is configured to provide cellular functionality means, wireless fidelity (WiFi) functionality means and Bluetooth functionality means,
wherein the apparatus has dimensions of about 52 mm (W)×52 mm (L)×2 mm (H), or less.

25. The apparatus of claim 24, wherein the second encapsulation layer includes the first encapsulation layer.

26. The apparatus of claim 24, wherein the first encapsulation layer is separate from the second encapsulation layer.

27. The apparatus of claim 24, further comprising at least one electronic package component coupled to the printed circuit board (PCB), wherein the at least one electronic package component is external to the package on package (PoP) device.

28. The apparatus of claim 27, wherein the package on package (PoP) device and the at least one electronic package component are configured to provide cellular functionality means, wireless fidelity (WiFi) functionality means and Bluetooth functionality means.

29. The apparatus of claim 24, wherein the gap controller is located between the first package and the second package, and wherein the gap controller is configured to provide a minimum gap between the first package and the second package.

30. A method for fabricating an integrated device, comprising:
providing a printed circuit board (PCB);
coupling a package on package (PoP) device to the printed circuit board (PCB), wherein coupling the package on package (PoP) device comprises:
 providing a first package comprising a first electronic package component; and
 coupling a second package to the first package such that there is a spacing between the first electronic package component and the second package, wherein the spacing is in a range of about 10-100 microns (μm);
 forming a gap controller configured to provide the spacing between the first electronic package component and the second package, the gap controller including a spacer and an adhesive layer;
forming a first encapsulation layer between the first package and the second package such that the first encapsulation layer is coupled to the first package and the second package, the first encapsulation layer located over the gap controller and configured to at least partially encapsulate the gap controller including the spacer and the adhesive layer; and
forming a second encapsulation layer that at least partially encapsulates the package on package (PoP) device,
wherein the integrated device is configured to provide cellular functionality, wireless fidelity (WiFi) functionality and Bluetooth functionality,
wherein the integrated device has dimensions of about 52 mm (W)×52 mm (L)×2 mm (H), or less.

31. The method of claim 30, wherein the second encapsulation layer includes the first encapsulation layer.

32. The method of claim 30, wherein the first encapsulation layer is separate from the second encapsulation layer.

33. The method of claim 30, further comprising at least one electronic package component coupled to the printed circuit board (PCB), wherein the at least one electronic package component is external to the package on package (PoP) device.

* * * * *